US008412290B2

(12) United States Patent
Shamim et al.

(10) Patent No.: US 8,412,290 B2
(45) Date of Patent: Apr. 2, 2013

(54) MINIATURIZED, LOW POWER, WIRELESS TRANSMITTER AND RECEIVER WITH ON-CHIP ANTENNA, AND WIRELESS COUPLING OF ON-CHIP AND OFF-CHIP ANTENNA

(75) Inventors: Atif Shamim, Mississauga (CA);
Muhammad Arsalan, Cornwall (CA);
Langis Roy, Ottawa (CA)

(73) Assignees: Atif Shamim, Milton (CA);
Muhammad Arsalan, Cornwall (CA)

( * ) Notice: Subject to any disclaimer, the term of this patent is extended or adjusted under 35 U.S.C. 154(b) by 643 days.

(21) Appl. No.: 12/580,654

(22) Filed: Oct. 16, 2009

(65) Prior Publication Data

US 2010/0099367 A1    Apr. 22, 2010

Related U.S. Application Data

(60) Provisional application No. 61/105,921, filed on Oct. 16, 2008.

(51) Int. Cl.
*H04M 1/00*    (2006.01)
(52) U.S. Cl. .................... 455/575.7; 343/728; 343/729; 257/7
(58) Field of Classification Search ........ 455/41.1–41.3, 455/575.7, 562.1, 550.1; 257/7; 438/67; 343/728
See application file for complete search history.

(56) References Cited

U.S. PATENT DOCUMENTS

| | | | |
|---|---|---|---|
| 7,466,998 B2* | 12/2008 | O et al. ...................... | 455/575.7 |
| 2005/0251033 A1* | 11/2005 | Scarantino et al. ............ | 600/436 |
| 2009/0061796 A1* | 3/2009 | Arkko et al. .................. | 455/121 |
| 2009/0257529 A1* | 10/2009 | Popplewell et al. .......... | 375/320 |
| 2009/0273418 A1* | 11/2009 | Shimizu et al. .............. | 333/24 R |
| 2012/0205452 A1* | 8/2012 | Rofougaran ................... | 235/492 |

FOREIGN PATENT DOCUMENTS

| | | |
|---|---|---|
| CA | 2547372 A1 | 11/2007 |
| WO | 2007134422 A1 | 11/2007 |

OTHER PUBLICATIONS

I. Wolff, "Design and Technology of Microwave and millimiterwave LTCC Circuits and Systems", Signals, Systems and Electronics, Interantional Symposium, pp. 505-512, Aug. 2007.*
Lamminen et al., "60-GHz Patch Antennas and Arrays on TLCC With Embedded-Cavity Substrates", IEEE Transactions on Antennas and Propagation, vol. 56, No. 9, pp. 2865-2873, Sep. 2008.*

(Continued)

*Primary Examiner* — Nay A Maung
*Assistant Examiner* — Angelica Perez
(74) *Attorney, Agent, or Firm* — Dennis R. Haszko

(57) ABSTRACT

A miniaturized, low power RF transmitter with a dual mode active on-chip antenna/inductor is disclosed in which antenna also serves as the oscillator inductor. Also disclosed is a miniaturized low power RF receiver with an on-chip antenna; and a RF transmitter system wherein an on-chip antenna is wirelessly coupled to an off chip patch antenna are disclosed. Advantageously, the TX chip is housed in a low loss, e.g. Low Temperature Co-fired Ceramic (LTCC) package with a patch antenna to provide a System-on-Package implementation comprising electromagnetic coupling between a RF TX chip comprising an integrated on-chip antenna and a package antenna. The on-chip antenna feeds the LTCC patch antenna through aperture coupling, thus negating the need for RF buffer amplifiers, matching elements, baluns, bond wires and package transmission lines, and significantly increases the gain and range of the module with respect to the on-chip antenna alone, without deterioration of the circuit performance and power consumption. Exemplary embodiments are disclosed which may be fabricated using standard CMOS technology, for operation in the 5 GHz U-NII band for applications such as miniaturized, low cost, low power wireless devices and sensor systems.

20 Claims, 26 Drawing Sheets

OTHER PUBLICATIONS

Jian Xu et al., "2.8GB/s Inductively coupled Interconnect for 3-D ICs", 2005 Symposium on VLSI Circuits Digest of Technical Papers, pp. 352-355. 2005.*

A. Shamim, P. Popplewell, V. Karam, L. Roy, J Rogers and C. Plett, "5.2 GHz On-Chip Antenna/Inductor for Short Range Wireless Communication Applicaions," Antenna Technology Small Antenna and Vovel Metamaterials, 2006 IEEE International Workshop, pp. 213-216.*

A. Natarajan, A. Komijani, X. Guan, A. Babakhani, A. Hajimiri, "A 77-GHz Phased-Array Transceiver With On-Chip Antennas in Silicon: Transmitter and Local LO-Path Phase Shifting," Solid-State Circuits, IEEE Journal of, vol. 41, No. 12, pp. 2807-2819, Dec. 2006.

M. B. Nejad, H. Tenhunen, L. Zheng, "Chip-Package and Antenna Co- Design of a Tunable UWB Transmitter in System-on-Package with On-Chip versus Off-Chip Passives," Electronics Systemintegration Technology Conference, 2006, 1st , vol. 1, pp. 291-298, Sep. 2006.

J. Lee, N. Kidera, S. Pinel, J. Laskar, M. Tentzeris, "Fully Integrated Passive Front-End Solutions for a V-band LTCC Wireless System," Antennas and Wireless Propagation Letters, IEEE , pp. 285-288, 2007.

R. Li, et al., "Design of Compact Stacked-Patch Antennas in LTCC Multilayer Packaging Modules for Wireless Applications," Advanced Packaging, IEEE Transactions on, vol. 27, pp. 581-589, Nov. 2004.

I. Wolff, "Design and Technology of Microwave and Millimeter Wave LTCC Circuits and Systems," Signals, Systems and Electronics, International Symposium on, pp. 505-512, Aug. 2007.

K. Chan, E. Lee, P. Gardner, T. Dodgson, "Differential Aperture Coupling Technique for Passive and Active Integrated Antenna Design," Microwaves, Antennas & Propagation, IET , pp. 458-464, Apr. 2007.

T. Seki, K. Nishikawa, K. Cho, "Multi-Layer Parasitic Microstrip Array Antenna on LTCC Substrate for Millimeter-Wave System-on-Package," European Microwave Conference, pp. 1393-1396, Oct. 2003.

D. M. Pozar, "A Microstrip Antenna Aperture Coupled to a Microstrip Line," IEEE Electron Letters, vol. 21, No. 2, pp. 49-50, Jan. 17, 1985.

P. H. R. Popplewell, V. Karam, A. Shamim, J. Rogers, M. Cloutier and C. Plett, "5.2 GHz Self-Powered Lock and Roll Radio Using VCO Injection-Locking and On-Chip Antennas," Circuits and Systems, 2006, ISCAS 2006. Proceedings, 2006 IEEE International Symposium on, pp. 5203-5206, 2006.

A. Shamim, P. Popplewell, V. Karam, L. Roy, J. Rogers and C. Plett, "5.2 GHz On-Chip Antenna/ Inductor for Short Range Wireless Communication Applications," Antenna Technology Small Antennas and Novel Metamaterials, 2006 IEEE International Workshop on, pp. 213-216, 2006.

A. Shamim, P. Popplewell, V. Karam, L. Roy, J. Rogers and C. Plett, "Silicon Differential Antenna/Inductor for Short Range Wireless Communication Applications," Electrical and Computer Engineering, 2006, CCECE '06, Canadian Conference on, pp. 94-97, 2006.

A. Bevilaqua and A. M. Niknejad, "An Ultrawideband CMOS Low Noise Amplifier for 3.1-10.6-GHz Wireless Receivers," IEEE J. Solid-State Circuits, vol. 39, No. 12, pp. 2259-2268, Dec. 2004.

A. Shamim, V. Karam, P. Popplewell, L. Roy, J. Rogers, and C. Plett, "A CMOS Active Antenna/Inductor for System on a Chip (SoC) Applications," in IEEE Antennas Propag. Soc. Int. Symp. (AP-S'08), Jul. 5-11, 2008, pp. 1-4.

Muhammad Arsalan, et al., "A Fully Differential Monolithic LNA with On-Chip Antenna for a Short Range Wireless Receiver," Oct. 2009, IEEE Microwave and Wireless Components Letters.

Atif Shamim, "Wireless System on Chip and System-on-Package Design for Biomedical Applications," Ph.D. Thesis, Carleton University 2009.

Muhammad Arsalan, "Wireless System on Chip Sensor Design for Radiotherapy Applications," Ph.D. Thesis, Carleton University, 2009.

Shamim, A, et al., "Wireless Interconnect Between On-Chip and LTCC Antennas for System-in-Package Applications," Proceeding of the 1st European Wireless Technology Conference, Amsterdam, The Netherlands, Oct. 2008.

A. Shamim, M. Arsalan and L. Roy, "5 GHz Monolithic CMOS Transmitter and Antenna for Short-Range Communications," Antennas and Propagation, 2007, EuCAP 2007, The Second European Conference on, pp. 1-5, 2007.

* cited by examiner

A

B

A

B

TABLE I
PERFORMANCE COMPARISON FOR DIFFERENT TX MODULES

| Module Type | Power Consumption | Gain | Range |
|---|---|---|---|
| Stand alone TX chip | 3.3 mW | -34 dBi | 1 m |
| TX chip in conventional LTCC package | 38 mW | -1 dBi | 75 m |
| TX chip in proposed LTCC package | 3.3 mW | -2.3 dBi | 24 m |

Figure 26

MINIATURIZED, LOW POWER, WIRELESS TRANSMITTER AND RECEIVER WITH ON-CHIP ANTENNA, AND WIRELESS COUPLING OF ON-CHIP AND OFF-CHIP ANTENNA

CROSS REFERENCE TO RELATED APPLICATIONS

This application claims priority from U.S. provisional application Ser. No. 61/105,921, entitled "Miniature Wearable Wireless Biomedical Sensor System", filed 16 Oct. 2008, which is incorporated herein by reference.

FIELD OF THE INVENTION

This invention relates to miniaturized, low power, wireless transmitters and receivers with on-chip antennas, wireless coupling of on-chip and off-chip or package antennas, and more particularly, to system on-chip (SoC) and System-on-Package (SoP solutions for a range of low power wireless communications, such as wireless LAN and sensor systems for biomedical applications.

BACKGROUND OF THE INVENTION

The use of mobile, handheld or fixed wireless devices for voice and data communications, monitoring, tracking, controlling, test and measurement has been growing prolifically in recent years as further advances in miniaturized, lower power, low cost electronics are achieved. Wireless terminals and networks are now used for numerous industrial applications including environmental monitoring, smart metering, asset tracking, and financial transactions. Whether for personal or industrial use, users are looking for increased functionality and further miniaturization of wireless devices.

Wireless sensor systems and sensor networks are finding applications in many fields. Miniaturized sensors are now available for monitoring a wide variety of biomedical, physical, chemical and environmental parameters. Elimination of wired connections is particularly desirable for sensor systems for bio-medical monitoring and space applications.

Integration of analog, digital and RF electronics for such applications presents a number of challenges. In particular, miniaturized RF electronics require innovative designs to achieve compact yet efficient wireless systems. Typically, a large part of most wireless devices is devoted to a power supply, the antenna, and wireless transmitter (TX) and receiver (RX) circuitry. For example, in a typical smart mobile phone, only 10% of components are electronics, while 90% is passives, boards and interconnect, with the battery and antenna taking up a large part of the volume. Consequently, a significant amount of research is currently being directed to developing components with reduced size and lower power operation, and particularly miniaturized antennas.

Much recent research is focused on System-on-Chip (SoC) and System-on-Package (SoP) solutions. Performance improvements in advanced CMOS integrated circuit (IC) technology have paved the way for integration of RF components with analog and digital circuits on a single chip. RF CMOS devices that exhibit high cut-off frequencies, high performance integrated passives, and lower operating voltages, potentially allow for development of SoC solutions using lower cost standard process technologies. SoC systems have already been widely accepted for applications such as wireless LAN, Bluetooth, and are making inroads into cellular transceivers, GPS receivers, and wireless sensor networks.

On the other hand, substrate noise and low Q passives remain a challenge for efficient CMOS SoC implementations (see for example: A. Natarajan, A. Komijani, X. Guan, A. Babakhani, A. Hajimiri, "A 77-GHz Phased-Array Transceiver With On-Chip Antennas in Silicon: Transmitter and Local LO-Path Phase Shifting," Solid-State Circuits, IEEE Journal of, vol. 41, no. 12, pp. 2807-2819, December 2006. and M. B. Nejad, H. Tenhunen, L. Zheng, "Chip-Package and Antenna Co-Design of a Tunable UWB Transmitter in System-on-Package with On-Chip versus Off-Chip Passives," Electronics System integration Technology Conference, 2006. 1st, vol. 1, pp. 291-298, September 2006).

SoP solutions provide for use thin film components and embedded passives instead of discrete components. To provide appropriate substrates for an antenna, there is interest in use of low loss substrates such as ceramics, and in particular, Low Temperature Co-fired Ceramic (LTCC) packaging substrates. These may be used in multi-layered packaging, and allow for embedding of passive components, and vertical integration of RF modules. While SoC is a more size efficient approach, on-chip antennas are usually very inefficient when implemented in silicon technology because of the lossy nature of low resistivity silicon substrates.

In known implementations of RF circuits using LTCC packaging, generally, the RF circuits are connected to the feed line of an LTCC package antenna through bond wires or solder balls (see for example: J. Lee, N. Kidera, S. Pinel, J. Laskar, M. Tentzeris, "Fully Integrated Passive Front-End Solutions for a V-band LTCC Wireless System," Antennas and Wireless Propagation Letters, IEEE, pp. 285-288, 2007; R. Li, et.al., "Design of compact stacked-patch antennas in LTCC multilayer packaging modules for wireless applications," Advanced Packaging, IEEE Transactions on, vol. 27, pp. 581-589, November 2004; I. Wolff, "Design and Technology of Microwave and Millimeter wave LTCC Circuits and Systems," Signals, Systems and Electronics, International Symposium on, pp. 505-512, August 2007). Typically, this arrangement requires an isolating buffer amplifier and bond pads on the chip. Moreover, these antennas must be matched to the RF circuits through matching elements. This approach not only requires a number of design steps, and increases cost and overall power consumption, but the presence of bond wires also makes the module less attractive.

Aperture coupling is a well-established technique for non-contact or wireless feeding of microstrip patch antennas. For example, a silicon based aperture coupled patch antenna has been demonstrated using a conventional microstrip feed line (K. Chan, E. Lee, P. Gardner, T. Dodgson, "Differential aperture coupling technique for passive and active integrated antenna design," Microwaves, Antennas & Propagation, IET, pp. 458-464, April 2007). However, this only eliminates the physical connection between the feed line and the antenna; the connections and components required between the integrated circuit (IC) and the antenna feed line cannot be removed. In theory, a parasitic coupling approach could be used to couple an array of patches to the IC (T. Seki, K. Nishikawa, K. Cho, "Multi-Layer Parasitic Microstrip Array Antenna on LTCC Substrate for Millimeter-Wave System-on-Package," European Microwave Conference, pp. 1393-1396, October 2003). However, the latter approach has not been demonstrated in chip-to-package coupling.

Miniaturization of the antenna dimensions is affected by operating frequency. Antenna dimensions are a significant fraction of a wavelength in dimension, and therefore, for systems running at lower frequencies, such as the Unlicensed National Information Infrastructure (U-NIII) 5.2 GHz band, which is the international standard for indoor medical applications, antenna designs are quite large compared with those for higher frequency operation.

Another consideration is data rate. Design requirements for short range, lower frequency, wireless communications, e.g. transmission of low data rate sensor data, for example, are typically constrained by size and power consumption, rather than by requirements for high data rate or long transmission range for communications applications.

Also, regardless of frequency band, lossy substrates, parasitic coupling and interference from on-chip circuitry, or, e.g. conductive layers such as interconnect, or metal components such as batteries, in the vicinity of an antenna, can affect the design and performance. Modeling and simulations that take into account these effects, and characterization of on-chip antennas by measurement of actual antenna gain and radiation pattern is complex.

In the higher frequency ranges, transceivers with on-chip antennas have been demonstrated at 77 GHz using non-standard process technology with additional process steps (I. Wolff, "Design and Technology of Microwave and Millimeter wave LTCC Circuits and Systems," Signals, Systems and Electronics, International Symposium on, pp. 505-512, August 2007), and at 24 GHz, on a high resistivity SiGe platform (D. M. Pozar, "A microstrip antenna aperture coupled to a microstrip line," IEEE Electron Letters, vol. 21, no. 2, pp. 49-50, January 17, 1985).

A 5.2 GHz PLL VCO TX with an on-chip antenna that radiates with reasonable efficiency is disclosed in Canadian Patent application no. CA 2,547,372, and in a related publication (P. H. R. Popplewell, V. Karam, A. Shamim, J. Rogers, M. Cloutier and C. Plett, "5.2 GHz self-powered lock and roll radio using VCO injection-locking and on-chip antennas," Circuits and Systems, 2006. ISCAS 2006. Proceedings. 2006 IEEE International Symposium on, pp. 4 pp.-5206, 2006). Factors that need to be considered in the design of the on-chip antenna for the latter PLL VCO TX are discussed in related publications. There is a tradeoff in design to optimize both the radiation and inductive characteristics of the antenna (A. Shamim, P. Popplewell, V. Karam, L. Roy, J. Rogers and C. Plett, "5.2 GHz On-Chip Antenna/Inductor for Short Range Wireless Communication Applications," Antenna Technology Small Antennas and Novel Metamaterials, 2006 IEEE International Workshop on, pp. 213-216, 2006; and A. Shamim, P. Popplewell, V. Karam, L. Roy, J. Rogers and C. Plett, "Silicon Differential Antenna/Inductor for Short Range Wireless Communication Applications," Electrical and Computer Engineering, 2006. CCECE '06. Canadian Conference on, pp. 94-97, 2006). Antenna performance may be adversely affected by parasitic coupling and by interference between the antenna and the circuitry surrounding the on-chip antenna.

Thus, although circuits with on-chip antennas have been demonstrated, actual performance of most of these antennas has not been characterized, and in practice, on-chip antennas are not usually implemented because of the above-mentioned problems with lossy substrates, interference issues and characterization challenges.

Therefore, there is a need for further advances in miniaturization of low power and low cost wireless transmitter and receiver systems, particularly for wireless systems operating at lower frequencies, such as the 5 GHz U-NII band, which is used for a broad range of wireless LAN, biomedical, space and other applications.

SUMMARY OF THE INVENTION

Thus, the present invention seeks to circumvent or mitigate the abovementioned problems, or at least provide an alternative.

Aspects of the invention provide for a miniaturized, low power RF transmitter with an on-chip antenna, a miniaturized low power RF receiver with an on-chip antenna; and a RF transmitter module wherein an on-chip antenna is wirelessly coupled to an off chip patch antenna, such as an in-package antenna. Exemplary embodiments are disclosed which may be fabricated using standard CMOS technology, for operation in the 5 GHz U-NII band.

One aspect of the present invention provides a radio frequency (RF) transmitter comprising: a substrate carrying a monolithically integrated RF oscillator transmitter (TX) comprising an on-chip dual mode active antenna, wherein the on-chip antenna is inductive and acts as an inductor of the oscillator transmitter.

Preferably, the oscillator TX comprises a VCO and more particularly, is a direct feed open loop VCO TX, and the dual mode active antenna is optimized as both an antenna, and the oscillator inductor. An oscillator TX is a simple architecture, is low power, may be used for short range without a power amplifier, and the oscillator drives the antenna directly. The control line of oscillator is directly modulated by an input signal.

Preferably, the on-chip antenna is a rectangular loop antenna, which is inherently differential. A preferred embodiment of the VCO TX comprises LC cross-coupled differential VCO topology, wherein all active circuitry is placed within the loop of the antenna to minimize chip size. At least part of the antenna extends close to substrate edges free from active circuitry.

Another aspect of the present invention provides an RF receiver comprising: a monolithically integrated RF receiver circuit comprising an on-chip antenna, wherein the receiver comprises a low noise amplifier and a delay locked loop, and wherein the impedances of the on-chip antenna and the LNA are substantially conjugately matched.

The on-chip antenna may comprise a folded dipole, preferably a meandered structure to provide sufficient length, and the antenna is placed near edges of the substrate, and active elements of the LNA and demodulator are placed within the antenna area to minimize die size. Co-design of the antenna and LNA results in wideband matching without additional matching elements. The LNA preferably comprises a simultaneous noise and input power matched differential LNA. The demodulator preferably comprises a DLL demodulator to provide low noise, stable operation. A preferred embodiment of the DLL is a fast locking DLL comprising a voltage controlled delay line, a phase frequency detector, a charge pump and a loop filter which is designed for a locking range covering the 5 GHz U-NII band.

For RF RX circuits, co-design of the LNA with the antenna provide for conjugate matching of impedance eliminates the requirement for additional matching components, which also helps to reduce die size. Advantageously, the TX and RX modules may be fabricated in standard CMOS technology, using low resistivity substrates, and the antenna dimensions are ~1 mm$^2$, with active elements of the circuitry placed within the antenna area. Preferably the edges of the antenna loop are located close to edges of the chip on at least two edges of the chip substrate, to reduce interference from active circuitry or bond pads.

Yet another aspect of the present invention provides a radio frequency (RF) transmitter according as defined above, further comprising, monolithically integrated on the same substrate, an RF receiver circuit comprising an on-chip antenna, wherein the receiver comprises a low noise amplifier and a delay locked loop, and wherein the impedances of the on-chip antenna and the LNA are substantially conjugately matched.

A further aspect of the present invention provides an RF transmitter system comprising: a first substrate supporting a monolithically integrated circuit comprising an RF transmitter comprising an on-chip antenna, a ground plane overlying the on-chip antenna, a second substrate comprising a microstrip patch antenna overlying the ground plane and spaced therefrom by a gap; and an aperture defined in the ground plane for electromagnetic coupling of the on-chip antenna and the patch antenna.

Thus, wireless coupling of the TX integrated circuit comprising an on-chip antenna to a package antenna is provided by electromagnetic coupling from an on-chip antenna to an aperture, e.g. a slot in the ground plane, and eventually to the patch antenna. Preferably the aperture is a slot aligned to the feed point location, i.e. the TX chip antenna, and the slot length is selected relative to the patch antenna size to minimize backward radiation from the slot in the ground plane.

Advantageously, the first and second substrates of the package comprise a low loss material, preferably a low temperature co-fired ceramic LTCC multilayer substrate, which also allows for vertical integration of layers comprising the RF TX circuit, the ground plane and the package antenna respectively. By employing wireless interconnect between an RF chip and an LTCC package antenna, the design requires neither a buffer amplifier and connecting bond pad on the chip, nor matching elements or feed lines on the package. It also eliminates the requirement for a balun to connect differential circuits to the single-ended antennas, or vice versa. Conveniently, a SoP implementation provides a compact, low power transmitter module with extended range.

In a preferred embodiment, the RF TX system comprises a multilayer LTCC implementation, wherein the feed substrate comprises a substrate of an LTCC package carrying the RF TX chip with on-chip-antenna, and the antenna substrate comprises a superstrate of the LTCC package. A common ground plane is provided on a top surface of the LTCC substrate overlying the RF TX chip, with the slot in the ground plane aligned over the on-chip antenna. The LTCC superstrate carrying the patch antenna may be separated from the substrate by spacers to provide an air gap of a suitable thickness. The air gap, superstrate thickness; antenna dimensions, slot dimensions, and slot placement relative to the TX antenna and the patch antenna are determined through simulation to provide a required gain with an appropriate number and thickness of the LTCC layers.

To the applicants' knowledge, this is the first LTCC aperture coupled patch antenna implementation with direct feeding from a transmitter on-chip antenna.

Beneficially, embodiments of the invention provide for miniaturized wireless devices with excellent sensitivity, which can be fabricated in standard CMOS technology on a low resistivity substrate, having a size of ~0.5 cm² and consuming ~5 mW of power or less.

While the embodiments were designed for the 5 GHz U-NII band, similar design principles may be used to design miniaturized RF RX and RF TX circuits with integrated antennas for operation at other frequencies, e.g. ~1 GHz to ~10 GHz. Although standard CMOS implementations provide for low cost fabrication, custom processes or hybrid technologies may be preferred for some applications to optimize performance.

These and other features of the invention will become more apparent from the following description in which reference is made to the appended drawings.

BRIEF DESCRIPTION OF THE DRAWINGS

Embodiments of the invention will now be described, by way of example only, with reference to the following drawings:

FIG. 26 shows a table comparing power consumption, gain and range of three embodiments of RF TX circuits.

DETAILED DESCRIPTION OF THE EMBODIMENTS

Embodiments of the present invention are now described that provide miniaturized, low power, wireless RF transmitter and RF receiver systems with integrated antennas, which by way of example, are optimized for operation in the 5 GHz U-NII band. A co-design methodology was used, using electromagnetic, microwave and circuit simulators to tackle multi-domain issues of integrating RF, analog and digital elements. Integrated circuits according to these embodiments have been fabricated using standard CMOS to demonstrate the feasibility of fabricating miniaturized, low power RF receivers and transmitters with on-chip antennas using low cost standard silicon technology, on low resistivity substrates, and with a chip size ~1 mm$^2$ including an integrated on-chip antenna.

The following embodiments will be described in detail
a) An RF Transmitter (TX) with On-Chip Antenna
    The RF TX module is implemented as a system on a chip and comprises an on-chip loop antenna, with active elements of the oscillator TX placed within the antenna loop, and wherein the antenna is an inductive element, which acts as both the oscillator inductor and the loop antenna.
b) An RF Receiver with On-Chip Antenna
    The RF RX module is implemented as a system on-chip (SoC) comprising an on-chip antenna. To obtain a compact design, circuit elements comprising a low noise amplifier (LNA) and a demodulator are placed inside a folded dipole (meandered) antenna. The on-chip antenna is conjugately matched to the LNA over a wide frequency range. In the preferred embodiment the LNA is completely differential to provide low power and excellent gain, and the demodulator comprises a fully differential DLL demodulator for fast locking, low noise and wide bandwidth.
c) An LTCC Transmitter Module Comprising a RF Transmitter Integrated with a Package Antenna
    Two System in Package (SoP) implementations of a transmitter module are described, each comprising a monolithic RF TX integrated circuit coupled to package antenna for extended range
d) An LTCC Transmitter Module Comprising a RF Transmitter with On-Chip Antenna Wirelessly Coupled to an On-Package Antenna
    A System in Package (SoP) implementations of a transmitter module is described comprising a monolithic RF TX integrated circuit comprising an on-chip antenna and a package comprising a patch antenna, the on-chip antenna being aperture coupled to the package patch antenna.

Figure 1:
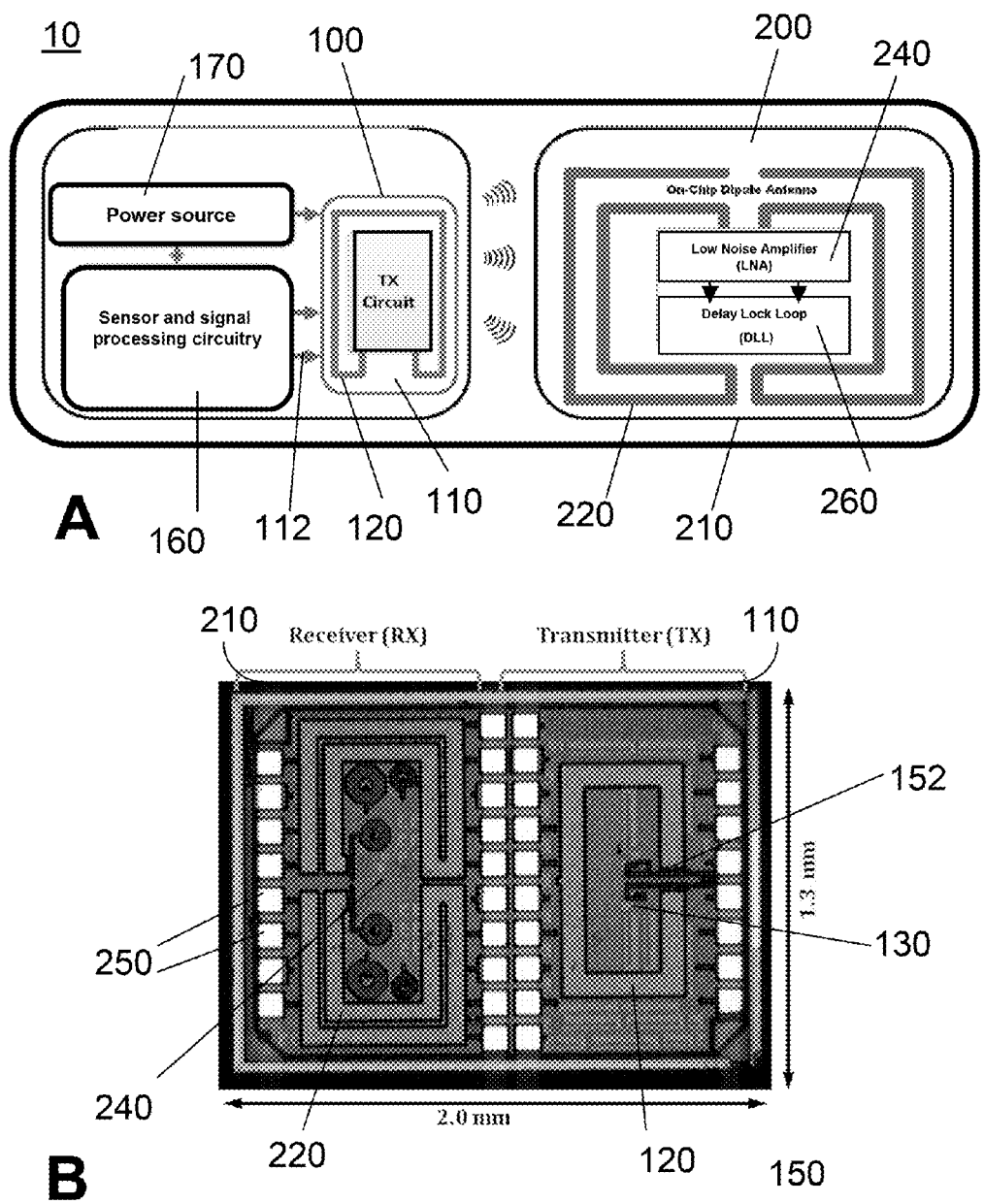
FIG. 1 shows, respectively, A) schematic system diagram and B) a photomicrograph of a system-on-chip (SoC) implementation of a RF TX integrated circuit with on-chip antenna and a RF RX integrated circuit with an on-chip antenna according to an embodiment of the present invention.

As illustrated in FIG. 1A, a transmitter/receiver system 10 according to a first embodiment of the present invention comprises a CMOS integrated circuit which comprises a monolithically integrated circuit (transmitter chip) 100 comprising a transmitter 110, and a monolithically integrated circuit (receiver chip) 200 comprising a receiver 210. In this exemplary embodiment, the transmitter 100 comprises a data signal source 160, which may be on a separate chip or monolithically integrated with the transmitter 110. The signal source 160 comprises, by way of example only, a low voltage sensor such as a biomedical sensor, integrated with signal processing electronics, and provided on a separate substrate. The data signal source generates a suitable low voltage output, which directly feeds the input 112 of the oscillator transmitter circuit 110. The oscillator transmitter circuit 110 comprises an on-chip loop antenna 120, as will be described in detail below (page 14). Also shown in FIG. 1A is an on-chip power source 170, i.e. typically a rechargeable power cell (battery) and/or ultracapacitor, for powering the electronics of the transmitter and sensor. The receiver chip 200 comprises a receiver (RX) circuit comprising a low noise amplifier (LNA) 240 and delay locked loop (DLL) demodulator 260, with an on-chip folded dipole antenna 220, which will also be described in detail below (page 18).

As indicated in the photomicrograph in FIG. 1B, the transmitter chip 110, (excluding the sensor and signal processing circuitry which are not shown) and the receiver chip 210, each with respective on-chip antennas 120 and 220, are shown fabricated side by side on the same substrate. As indicated in FIG. 1B, the dimensions of the receiver/transmitter chip, including bond (I/O) pads is 2.0 mm×1.3 mm. The transmitter circuitry 110 comprises a loop antenna 120 and active oscillator transmitter circuitry 130 inside the antenna loop, and bond pads 130 along two sides around the perimeter of the antenna. The receiver circuitry 210 comprises a folded dipole antenna 220, and all active circuitry comprising the LNA 240 and DLL demodulator 260 is placed within the area of dipole antenna, with bond pads 250 along two sides of the perimeter of the antenna. In particular, active circuitry is placed within area of the substrate enclosed by the antenna structure, I/O pads and active circuitry outside each antenna are provided along two sides and edges of the chip along the other two sides of each antenna are left free of active circuitry and bond pads so as not to interfere with radiation from the antenna.

RF Transmitter (TX) with On-Chip Antenna

Figure 2:
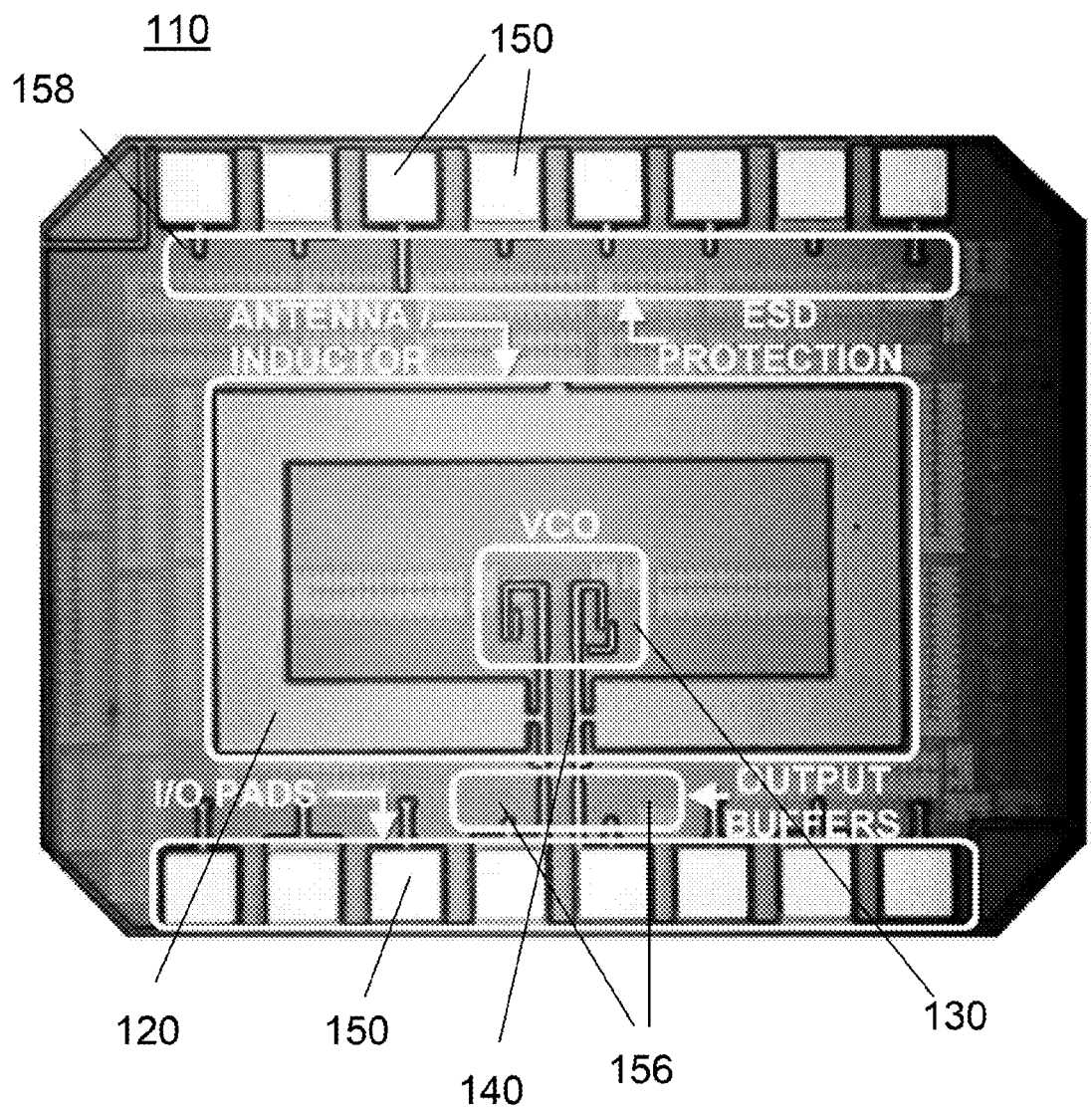
FIG. 2 shows an enlarged photomicrograph an RF VCO TX with on-chip antenna according to a first embodiment.

An RF TX circuit 110 according to a preferred embodiment of the invention is illustrated in more detail in FIGS. 2 to 6. Referring to FIG. 2, showing a photomicrograph of the circuitry 110, and FIG. 3 which shows a schematic chip layout, the RF transmitter comprises a monolithically integrated differential Voltage Controlled Oscillator (VCO) 130 within the area of the on-chip antenna 120, which may be realized in a standard 0.13 μm (IBM) CMOS process technology on a low resistivity 13.5Ω-cm silicon substrate. The TX is designed for the unlicensed 5.2 GHzUNII, indoor band used, for example, for biomedical applications. The inductor 120 of the VCO tank (see circuit schematic in FIG. 5) is optimized to perform double duty, acting as the on-chip antenna as well. Since the inductive element acts as both the VCO inductor and the antenna, it must be able to retain power at the same time it radiates power. The design is therefore required to yield a reasonably high inductance i.e. 1 nH-2 nH, as well as appropriate antenna properties, such as, a desirable radiation pattern and efficiency.

Antenna/Inductor Design for Dual Mode Active Antenna

Figure 3:
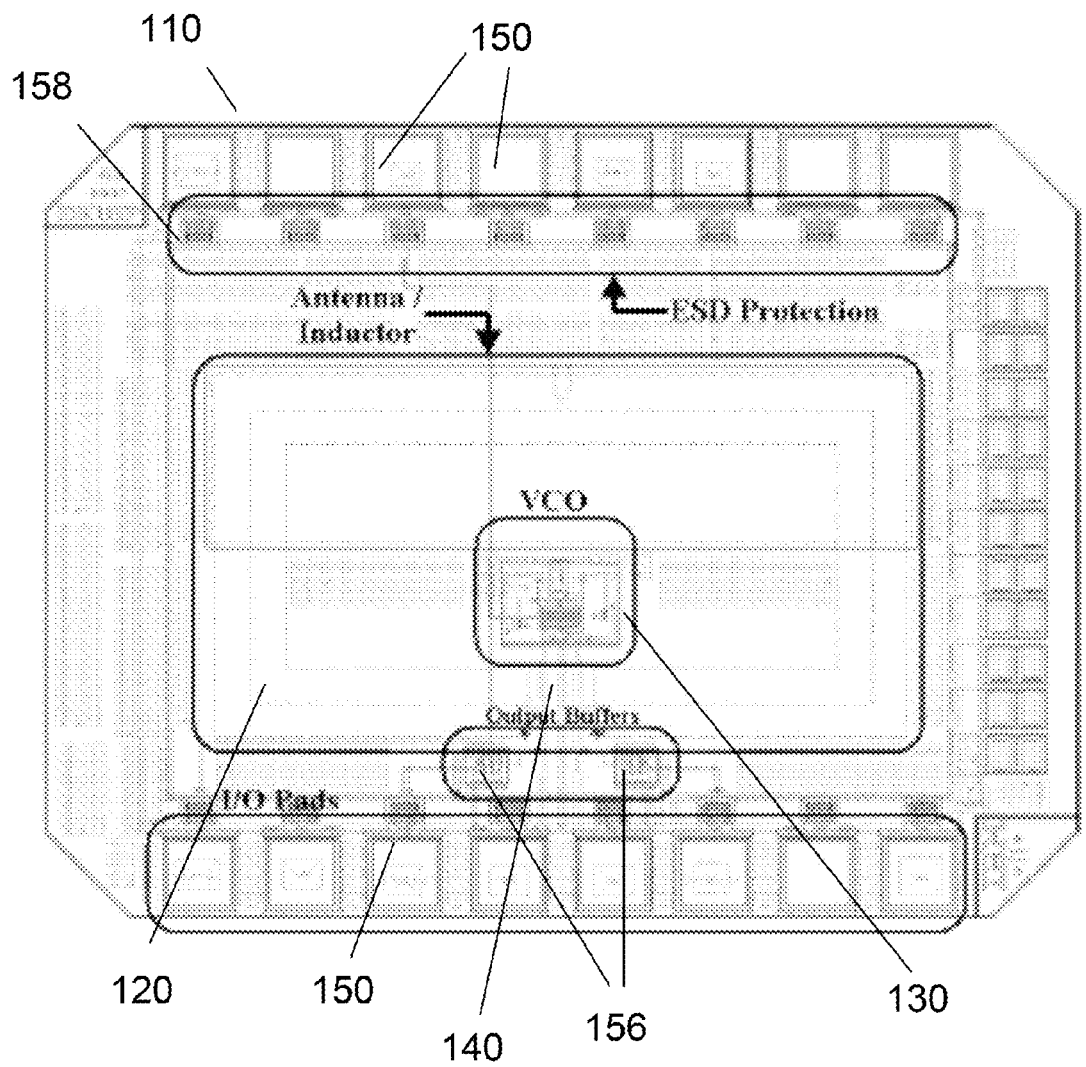
FIG. 3 shows a schematic diagram of part of the chip layout for the RF VCO TX with on-chip antenna corresponding to that shown in FIG. 2.

A loop antenna is a preferred implementation for this antenna/inductor design, because it is inherently inductive in nature and exhibits a broad radiation pattern. Moreover, since it is a differential antenna, it can be integrated with differential circuitry directly without needing a balun. Also, loop antenna geometry such as a square or rectangular loop as shown, allows placement of the active TX circuitry in the centre of the loop, thus minimizing die size, as illustrated in FIGS. 2 and 3.

In FIG. 2, which shows a photomicrograph of the chip layout, the top metallization layer is clearly visible defining the antenna/inductor layer 120 and interconnect (feed lines) 140 between the VCO TX 130, output buffers 165 and I/O pads 150. The chip layout diagram shown in FIG. 3 shows more of the underlying structures of the chip comprising the VCO TX 130 placed within the antenna/inductor loop, feed lines 140, output buffers 165 to I/O pads 150, which include ESD (Electrostatic Discharge Protection) structures 158.

Figure 4:
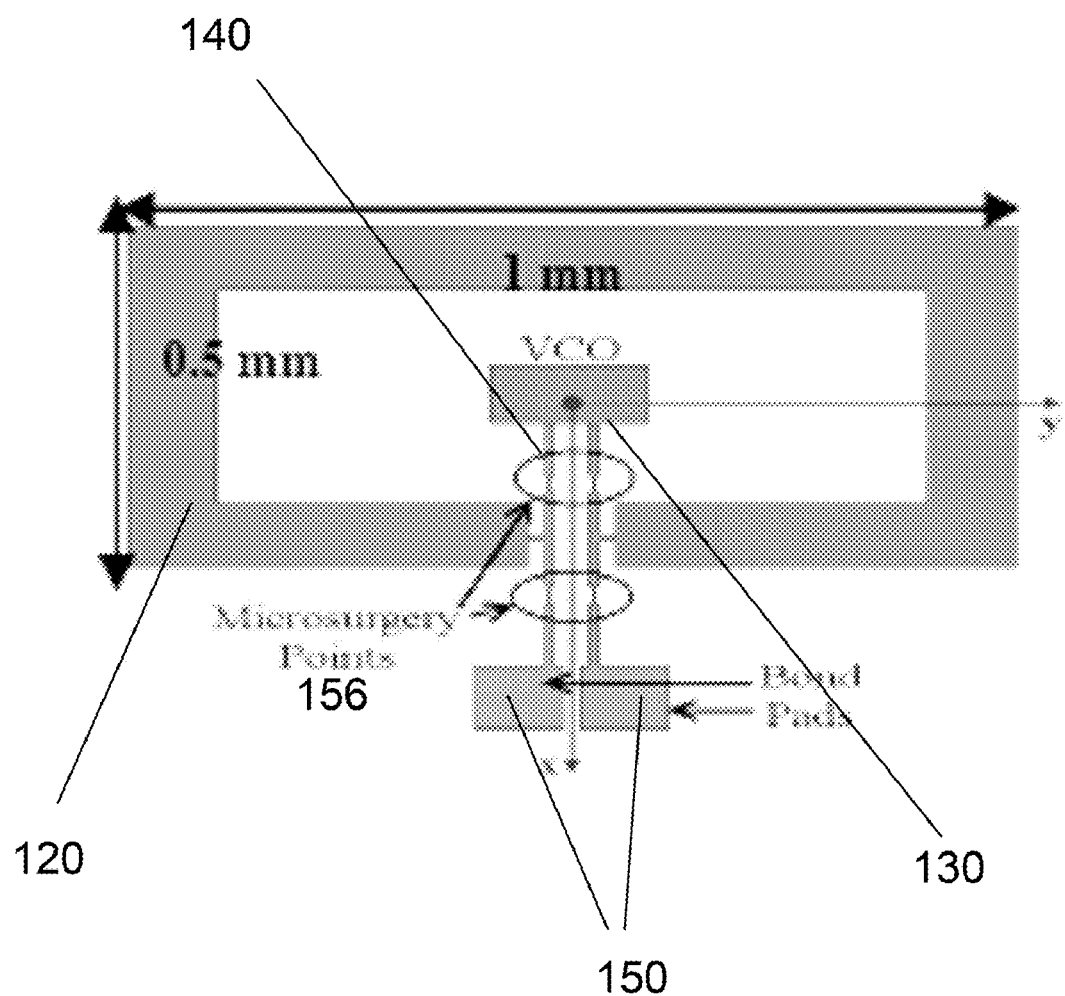
FIG. 4 shows a schematic diagram of the RF VCO TX antenna/inductor model used for simulations.

Since the antenna 120 serves as an inductor for the TX VCO, full 3-D electromagnetic simulations using the High Frequency Structure Simulator (HFSS) were employed to obtain the required inductance "L" and quality factor "Q" while optimizing the radiation efficiency. A lumped element model was then derived for the antenna/inductor. This model allows circuit simulation of the complete antenna/TX combination. The loop antenna/inductor simulated in HFSS is shown FIG. 4, which shows a schematic of the antenna geometry and dimensions, as used for simulation, and includes the antenna inductor comprising the antenna/inductor loop 120, feed lines 140 connecting the VCO 130 to the antenna loop 120, and bond pads 140 which are included for test purposes. The simulation did not include the VCO, but includes the bond pads 150, which as shown in FIG. 4, provide for testing the inductor/antenna. As shown in FIG. 4, the active circuitry of the VCO is placed in the centre of the antenna loop fed through feed lines 140, which include microsurgery points 156 for laser trimming. This allows for disconnection of the bond pads 150 through a laser trimming technique for normal operation of the VCO connected to the antenna, and also for testing of the antenna 120 independently of the VCO 130 (i.e. the latter may similarly be disconnected from the antenna 120 by trimming of the feed lines at microsurgery points 156. The on-chip antenna/inductor 120 of this design provides an inductance L of 1.3 nH with a Q of 19 at 5.2 GHz and demonstrates a gain of −34 dBi with the maximum radiation along the plane of the loop. The antenna is fabricated using the top metallization layer only of a 0.13 µm CMOS process technology. This top metal layer (aluminum) has a thickness of about 4 µm. The width of the metal line defining the antenna is about 100 µm.

VCO Oscillator TX

Figure 5:
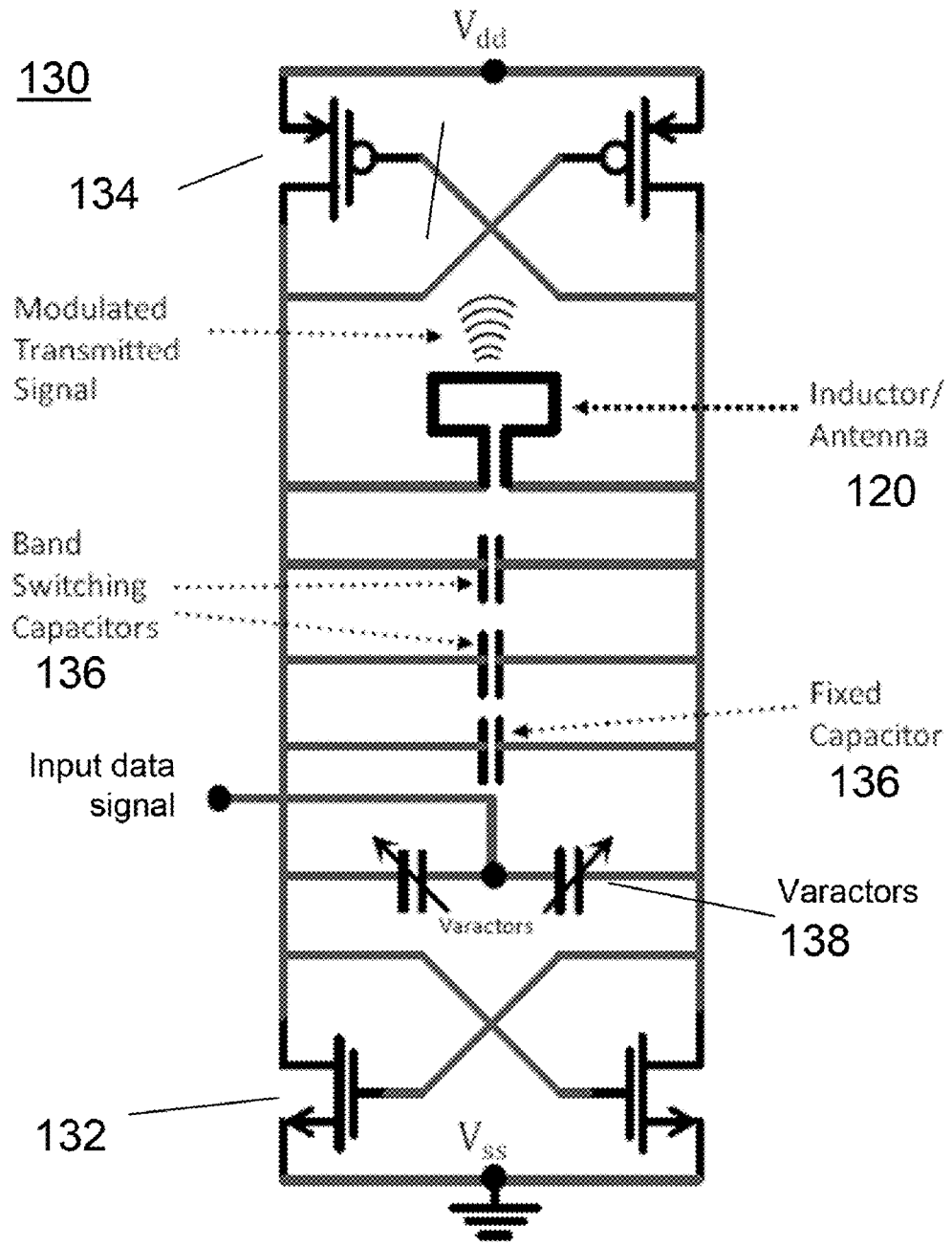
FIG. 5 shows a circuit schematic for the RF VCO TX circuit comprising an active dual mode on-chip antenna/inductor.
Figure 6:
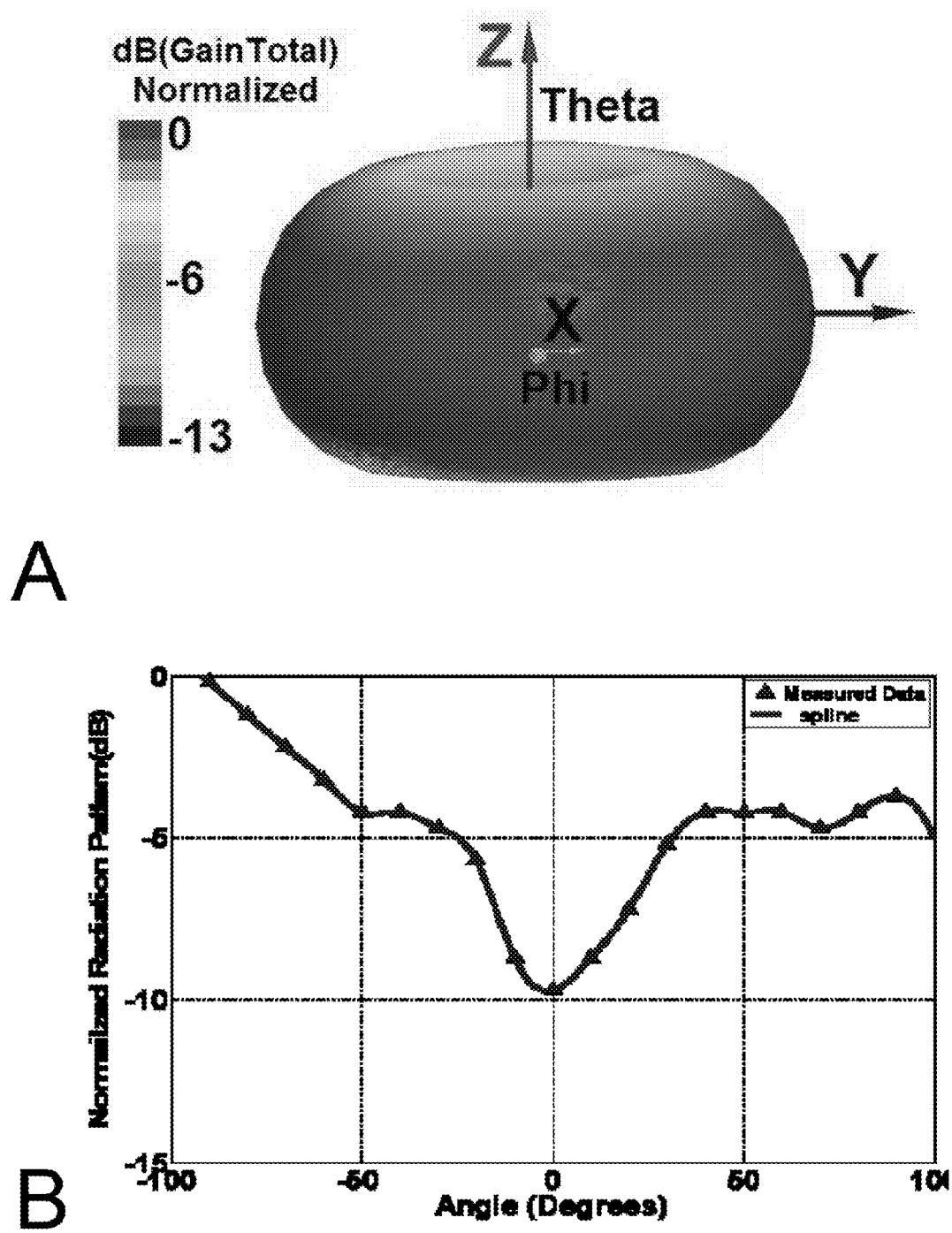
FIG. 6 shows A) the simulated radiation pattern for the antenna/inductor shown in FIG. 2, and B) the measured radiation pattern.

An inductor capacitor (LC) cross-coupled differential VCO topology has been chosen for this embodiment, as shown schematically in FIG. 5. The TX makes use of open loop direct VCO modulation, i.e. with no closed feedback loop. It uses both nMOS 132 and pMOS 134 transistors which generate negative resistance to cancel resonant tank losses. The resonant tank comprises the inductor/antenna 120, three band-switching capacitors 136 and two tuning varactors 138. In order to increase the output voltage swing, appropriate transistors are selected to adjust the bias current instead of using a current source.

The band switching capacitor bank 136 comprises three metal insulator metal (MIM) capacitors. Provision has been made to disconnect two of the MIM capacitors 136 to allow for switching of the band from to 5.25 to 5.5 GHz respectively. The MOS varactors 138 can provide fine-tuning of ±200 MHz around any of these bands. Maximum sensitivity of the TX is achieved by providing a control signal in the biasing range in which the MOS varactors exhibit maximum tenability, i.e. a biasing range of −0.2V to +0.2V.

As shown in FIGS. 2 and 3, a three-stage buffer 165 is provided at outputs on either side of the differential VCO. To ensure minimum loading on the VCO, the VCO outputs are buffered through cascaded inverters (not shown). The buffers 165 are included for system measurement and connection to external antenna and will usually remain off during the normal operation of the VCO TX. The buffers may be excluded if not needed for test purposes, or if an external (off chip) antenna is not required. A separate bias line for the buffer 165 ensures that they are turned on only when required. The TX chip can independently operate through the on-chip antenna with limited range, in which case the buffers remain off.

The antenna 120 is placed symmetrically in the centre of the chip substrate, with two sides of the loop close to the chip edges without any active circuitry, bond pads or top metal layer in close vicinity. The VCO TX 130 is placed in the centre of the loop antenna and has a guard ring protection for noise suppression (not clearly visible in FIG. 2 or 3). The metal width of the antenna shown in this embodiment is 100 µm.

The separate set of pads 150 is provided for passive inductor testing. The VCO 130 can be tested through the two buffers 165 at differential outputs. ESD protection structures 158 are implemented on all bond pads 150. Metal is inserted to meet the metal fill density specification of the process but care is taken that no top metal layer is filled close to the antenna 120, and a preferably, a minimum amount of metal is placed inside the loop. This miniature antenna inductor SoC occupies 0.5 mm$^2$ of chip space, which, to the applicants' knowledge, is the smallest area for an active antenna in the 5 GHz band reported as of the priority date. The VCO draws an average current of 2.8 mA and consumes 3.3 mW of power from a 1.2 V supply.

As described above, this embodiment uses direct modulation of a VCO TX via the VCO control line, with no closed feed back loop. While open loop direct VCO modulation does suffer from the fact that the output frequency is susceptible to undesired perturbation and noise, a number of other advantages are realized.

Ina previously reported design, which used an on-chip antenna with PLL oscillator TX circuit, placement of active circuitry outside the antenna loop was found to adversely impact radiation performance (P. H. R. Popplewell, V. Karam, A. Shamim, J. Rogers, M. Cloutier and C. Plett, "5.2 GHz self-powered lock and roll radio using VCO injection-locking and on-chip antennas," Circuits and Systems, 2006. ISCAS 2006. Proceedings, 2006 IEEE International Symposium on, pp. 4 pp.-5206, 2006). The current design also has advantages over a PLL implementation because it avoids the data rate limitation due to loop bandwidth of a phase locked loop (PLL) circuit and because direct modulation of a closed loop VCO distorts the modulated waveform because of the negative feedback loop of the PLL. More particularly, a PLL circuit consumes more power than a single VCO and requires a reference signal which is an off chip crystal in most cases. Thus the embodiment presented herein for a RF TX with on-chip antenna and directly modulated VCO provided over 50% power reduction, about 33% reduction in module size, improved VCO phase noise behaviour, improved uniformity of the antenna radiation pattern (e.g. see FIG. 6) and eliminates the need for an off-chip reference.

Thus an antenna/inductor as described herein, optimized for dual mode operation as both the antenna and VCO tank inductor. This structure offers advantages over known inductive on-chip antennas, e.g. reduced physical size, improved communication range, and does not require a high resistivity substrate to compensate for the low antenna gain and large losses in a silicon substrate. More importantly this antenna has been characterized for its radiation properties for the first time, unlike previous inductor/antenna implementations

RF Receiver with Fully Differential LNA and On-Chip Antenna

Figure 7:
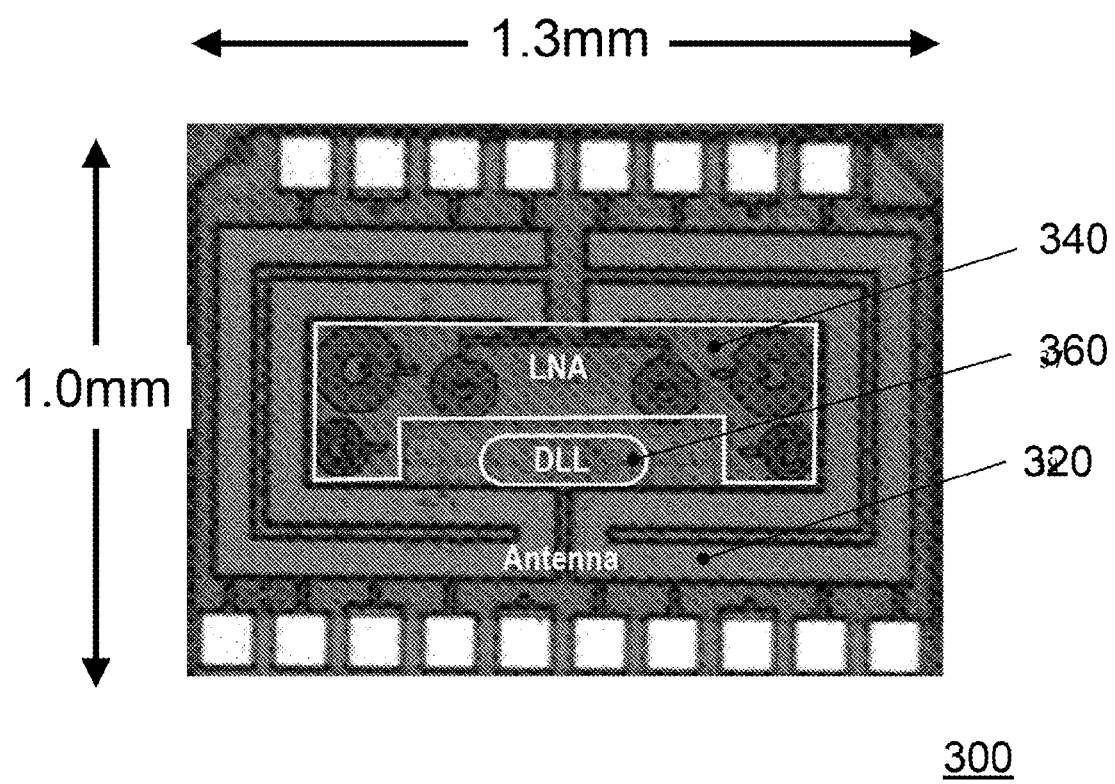
FIG. 7 shows a photomicrograph of a wireless receiver (RX) circuit with on-chip antenna according to a second embodiment of the invention.
Figure 8:
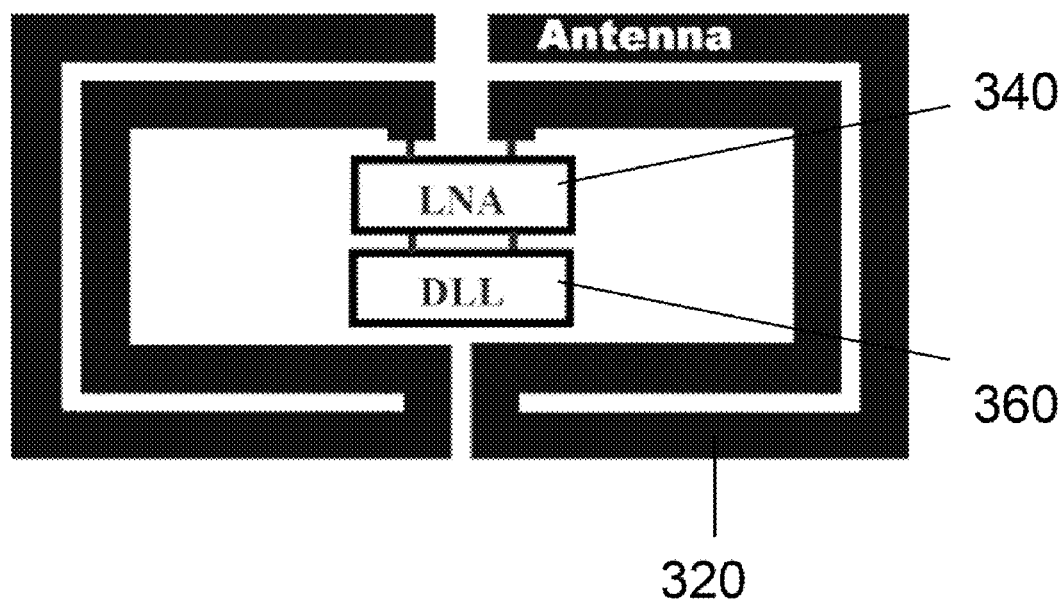
FIG. 8 shows a layout schematic of a wireless receiver (RX) circuit with on-chip antenna showing placement of the LNA and DLL, according to the second embodiment

A photomicrograph of a monolithically integrated RF transmitter circuit 300 according to a second embodiment of the present invention comprises an on-chip folded dipole antenna 320 is shown in FIG. 7. The RF RX circuit 300 comprises an on-chip antenna 320 monolithically integrated with a differential LNA 340 and DLL demodulator 360, which may be realized in a standard 0.13 µm CMOS process technology on a low resistivity 13.5 Ω-cm silicon substrate. FIG. 8 shows a schematic of the antenna geometry used for simulations and placement of the LNA and DLL demodulator within the area defined by the folded dipole antenna. The front end of the receiver is a low power, high gain LNA that is conjugately matched to an on-chip antenna, and designed to reject noise and improve received signal strength. The impedances of the on-chip antenna 320 and differential LNA are conjugately matched over a wide frequency range through the co-design of the circuits and antenna for simultaneous low noise and input power matching. In order to minimize the chip area, the active circuits of the LNA 340 and DLL 360 are placed inside the area enclosed by dipole antenna as shown in FIG. 8. This design provides the smallest design reported to date for a truly differential, CMOS receiver chip with an on-chip antenna for the 5 GHz band, which occupies only 1.3 mm$^2$ of chip space.

The LNA 340 and antenna 320 are designed interactively to conjugately match their impedances without the need for matching components. Initially the LNA is designed for simultaneous noise figure (NF) and input power matching. This results in a complex LNA impedance with a large real part. The on-chip antenna is then designed to conjugately match this complex impedance, however the real part of its impedance does not readily match that of the LNA. This is because the resistance of on-chip antennas realized in low resistivity Si is typically quite small. Therefore, the LNA impedance is tuned to reduce the real part, resulting in a slightly higher NF and lower gain while easing the conjugate matching.

Differential LNA

Figure 9:
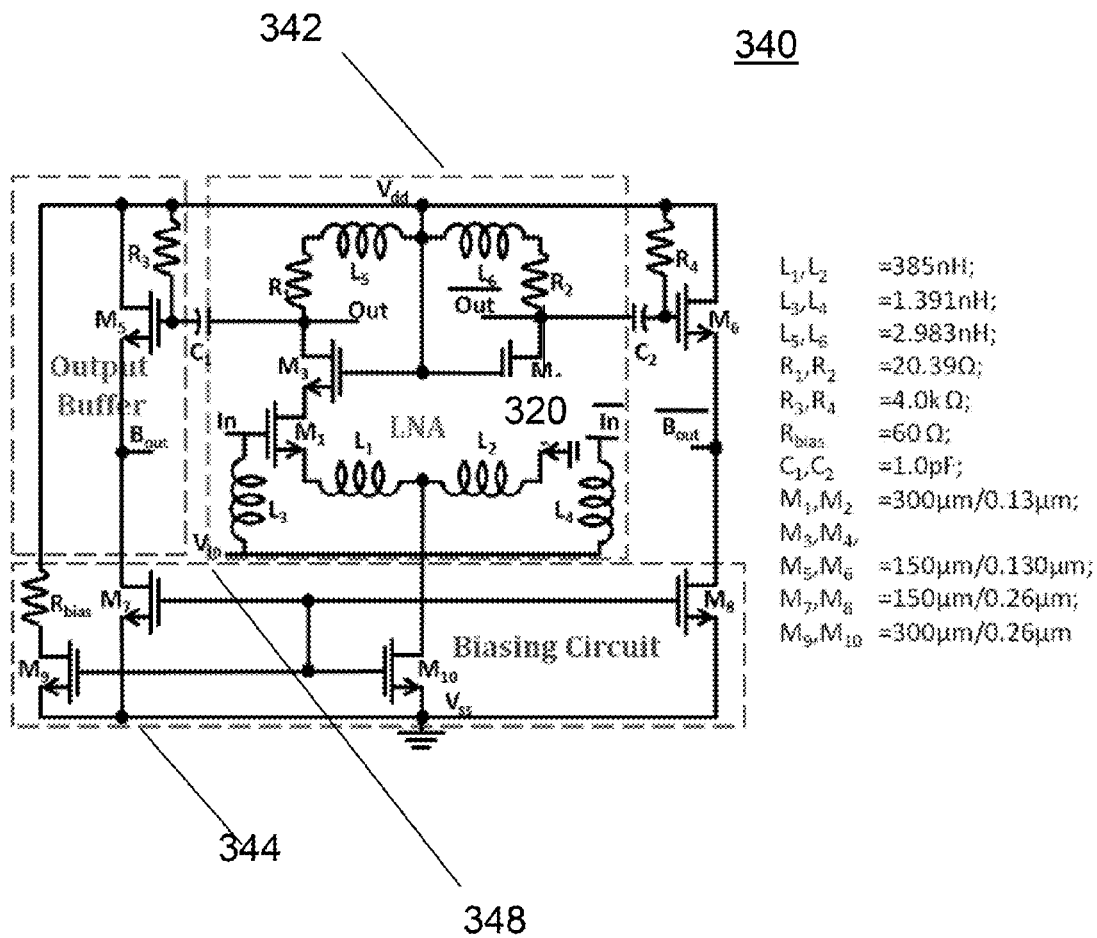
FIG. 9 shows a circuit block diagram schematic of the RF receiver with on-chip antenna of the second embodiment, comprising the LNA, output buffer and biasing circuit.

The chosen topology for the LNA design is based on the single ended wide band LNA, which employs an inductively degenerated common-source amplifier (A. Bevilacqua and A. M. Niknejad, "An ultrawideband CMOS low noise amplifier for 3.1-10.6-GHz wireless receivers," IEEE J. Solid-State Circuits, vol. 39, no. 12, pp. 2259-2268, December 2004,). Better performance, in terms of LNA gain and common mode noise rejection, can be achieved by a differential implementation, as shown in the circuit schematic illustrated in FIG. 9. The fully differential LNA 340 comprises a differential cascode LNA block 342, output 344 buffers for independent testing, and a biasing circuit comprising a current mirror 346. The device sizes, which are indicated in FIG. 9, were chosen by considering the trade-offs between power, noise and available gain. After achieving the minimum noise for the required current density, the LNA device sizes are adjusted to maximize gain. A NF of 2.9 dB (shown in FIG. 16) and IIP3 (Input 3$^{rd}$ order intercept point-a measure of linearity) of −5 dBm are achieved at 5.2 GHz. It should be noted that an additional bias point has been incorporated, shown in FIG. 9 as $V_{in}$ 348, to provide flexibility for tuning the LNA performance.

On-Chip Antenna

Figure 13:
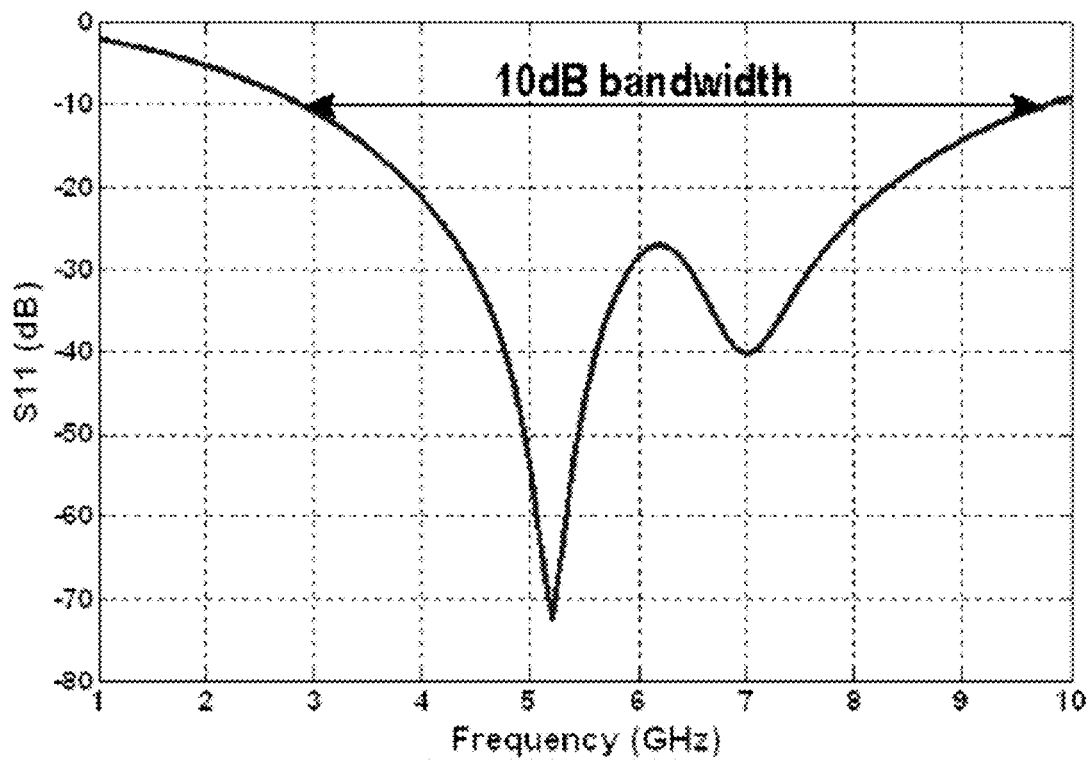
FIG. 13 shows a graph illustrating the simulated S11 of the on-chip antenna referenced to the complex impedance of the LNA.
Figure 14:
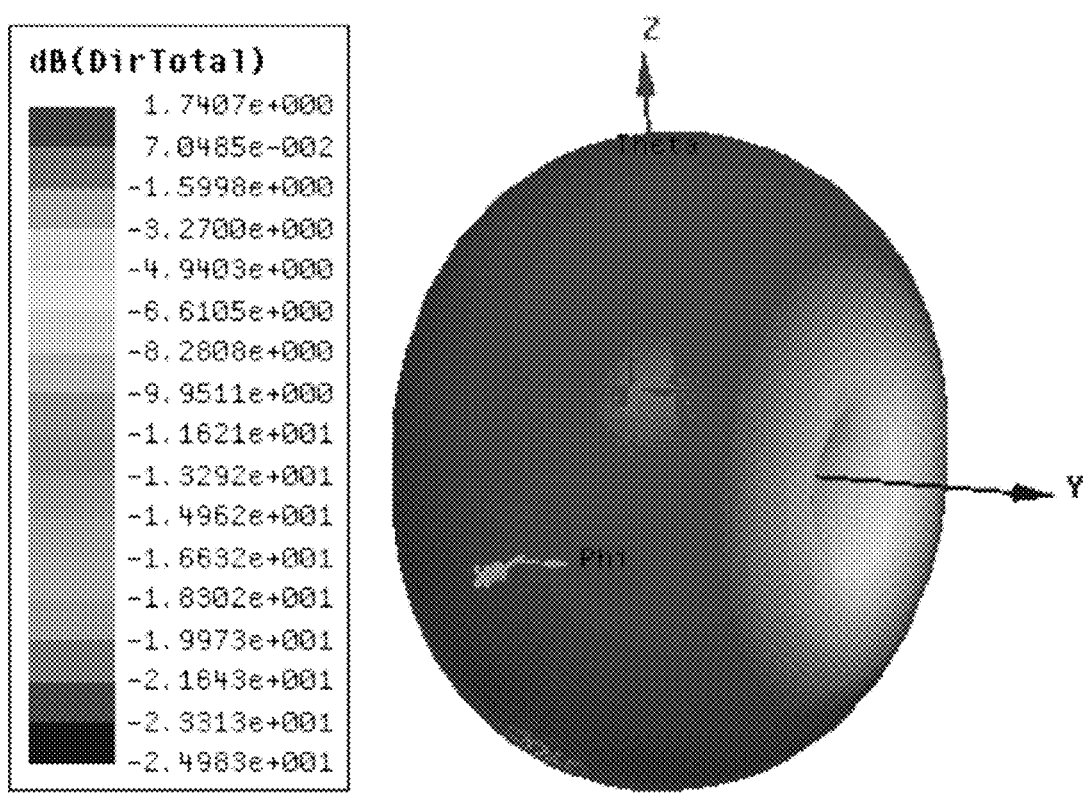
FIGS. 14 and 15, respectively, show the simulated on-chip antenna radiation pattern and measured on-chip radiation pattern.

HFSS simulations are used in designing the on-chip antenna. For optimum performance, the antenna must be conjugately matched to the LNA. This eases the stringent requirements of matching both the antenna and LNA to 50Ω, and also eliminates the need for matching elements. In this work, a 5.2 GHz on-chip antenna has been designed in conjunction with the LNA to simultaneously obtain minimum NF and maximum power transfer. The on-chip antenna is realized in the 4 µm thick top aluminum (Al) metal layer. A dipole antenna is chosen in order to drive the differential LNA without a balun. As shown in FIGS. 7 and 8, the dipole arms are folded to fit into a chip space of 1.3 mm×1 mm. Since the LNA 340 is placed inside the dipole antenna 320, in the final layout, for simulation, it is fed through two internal lumped ports in HFSS to replicate the LNA connection with the antenna. The optimized differential impedance of the LNA at 5.2 GHz is 91+j124Ω, and the on-chip antenna is designed to conjugately match to this impedance. This is accomplished by lengthening the dipole antenna. However, this mostly increases the loss resistance instead of the radiation resistance of the antenna. The trade-off in matching to a large LNA real impedance is a reduced antenna gain. It is observed that increasing the metal width increases the antenna gain, however due to fabrication specifications, it is limited to 100 µm. Care has been taken that, in the available chip space, the gap between the conductors is sufficient so that oppositely directed current does not cancel the radiated fields. Nonetheless, due to the lossy nature of the Si substrate, this effect is minimal relative to substrate losses. In simulations, a sensitivity analysis is done to choose suitable locations of the LNA elements with respect to the antenna so as to achieve minimum spacing between the various elements. The final dimensions of the antenna 1.3 mm×0.7 mm result in a differential impedance of 90-j133Ω at 5.2 GHz, which yields an excellent match between the on-chip antenna 320 and the LNA 340 impedances, as shown in FIG. 13. It is worth mentioning here that the co-design of antenna and LNA helps to achieve a wide impedance bandwidth. Simulations reveal a bore-sight maximum radiation pattern with a gain of −35 dBi (FIG. 14). It is also observed in simulations that placing the antenna closer to the chip edges slightly increases the gain. Measured and simulated on-chip antenna radiation patterns are compared in FIGS. 14 and 15.

DLL Demodulator

A Delay Locked Loop based receiver has been designed due to the simplicity of the architecture, easier monolithic integration, along with inherent low noise and stable behaviour. A fully differential design is adopted to go hand in hand with the differential front end LNA 340 and on-chip antenna 320 in order to eliminate common mode noise. Recently, the Delay Locked Loop (DLL) based receivers are gaining popularity due to their simplicity and inherent performance advantages. Compared to PLLs, DLLs do not accumulate jitter. For this reason, the DLLs are inherently less noisy than the PLLs. The DLL is a stable first order system. The locking time of a DLL is faster and the loop filter is easier to design and integrate than in a PLL. DLLs are generally easier to design. However, a DLL is more dependent on the reference signal than is a PLL, and its locking range is limited. An analog DLL is reported to use less power and area, and provides better timing performance and hence, smaller long-term jitter and phase resolution that enables smaller maximum phase step. Therefore an analog DLL topology is adopted for the demodulation of received signals.

Figure 10:
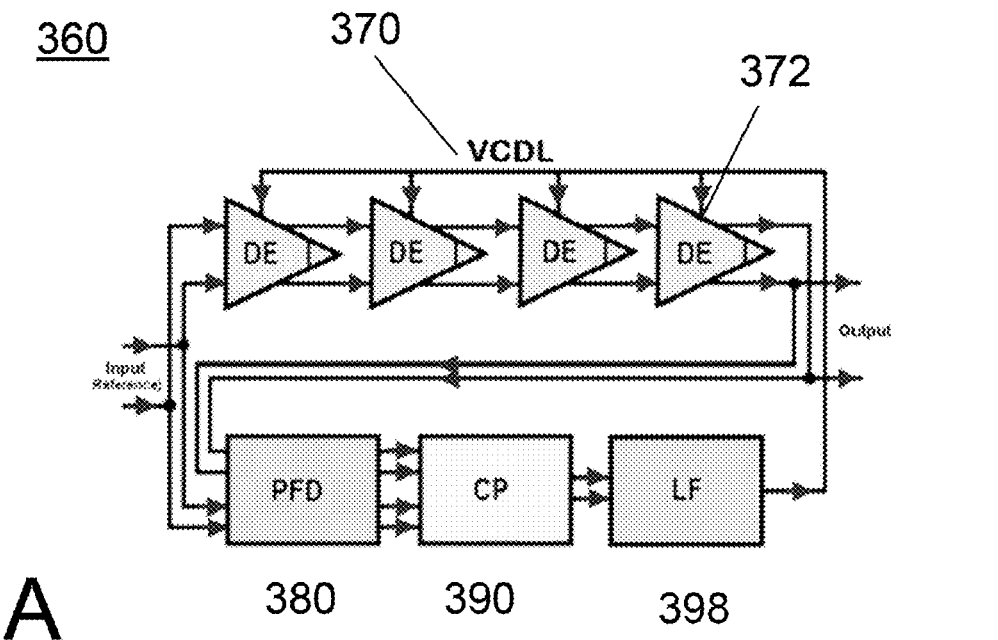
FIG. 10 shows (A) a block diagram of the differential analog DLL demodulator of the RF RX and (B) a circuit schematic of one of the Delay Elements (DE) of the Voltage Controlled Delay Line (VCDL)
Figure 10:
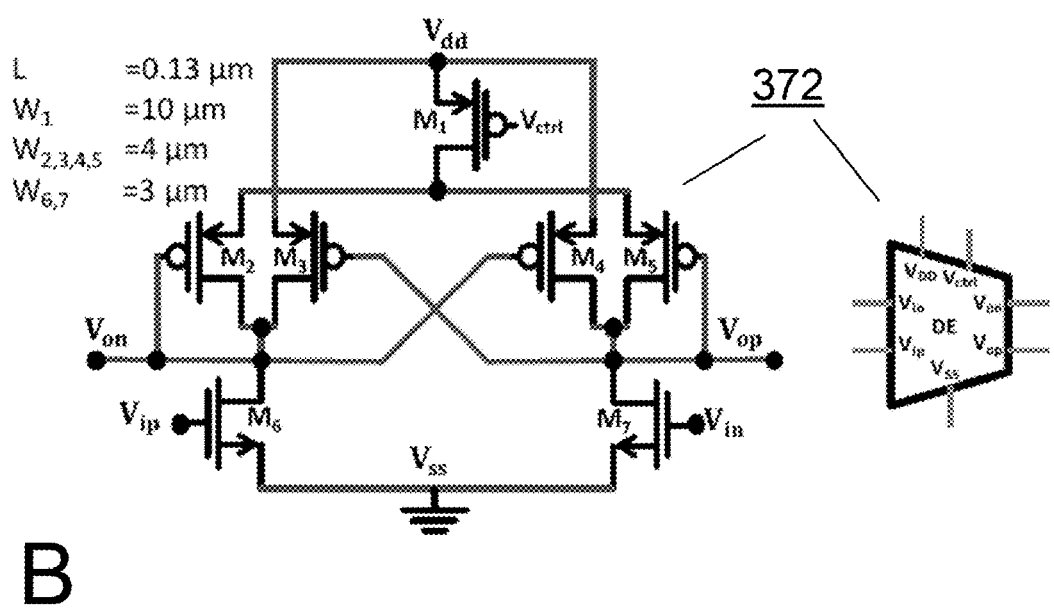

The fully differential fast locking DLL 360 used in this embodiment is shown in FIG. 10 and is capable of operating in a noisy environment. It comprises Current Mode Logic ("CML") based delay elements, i.e. voltage controlled delay line (VCDL) 370 to ensure a wide band of operation. The Phase Frequency Detector ("PFD") 380 results in fast locking to frequencies within the operating bandwidth and is generic enough to accommodate most modem modulation schemes.

The LNA output is connected to the DLL input, feeding Voltage Controlled Delay Line (VCDL) 370 and Phase and Frequency Detector (PFD) 380. The design details of the individual receiver components are presented in the following sections.

Voltage Controlled Delay Line (VCDL)

Within the DLL 360, one of the most fundamental components is the delay element (DE). 372 A VCDL 370 is a series combination of these DEs. The design of the differential DE 372 is shown in FIG. 10A. The circuit elements of the DE were selected to provide sufficient flexibility in the delay so that DLL 360 can lock in the desired frequency range. The targeted range for the DLL operation was 5-6 GHz. Extra bandwidth was considered to compensate for any change in the other design elements.

The DLL design uses a VCDL 370 comprising four of these DEs 372 connected in series, as shown in FIG. 10A. Hence each of them is responsible for providing a quarter of the delay needed for the frequency of interest. In our case for circuit operation in the U-NII band, frequency shift between and within the channel could be roughly from 5 to 6 GHz. It reflects to a total delay of 200 ps (@5 GHz) to 166.67 ps (@6 GHz). In a 4-stage VCDL each DE is responsible to provide quarter of the total delay. i.e. from 50 ps to 41.66 ps. Hence the DEs are designed to have a minimum delay of 41.66 ps that can be increased via $V_{ctrl}$ to 50 ps to fulfill the design requirement.

Phase Frequency Detector (PFD)

The role of PFD 380 within DLL is to take two input clocks $V_R$ and $V_o$ and examines the difference of phase and frequency between them. The designed phase detector is completely differential and produces two differential outputs, Pulse-Up (U) and Pulse-Down (D). If $V_R$ is leading $V_o$ then the U signal will become larger than D and vice-versa. If $V_R$ and $V_o$ are in phase then the U and D signals will be the same. The designed PFD 380 is an asynchronous sequential logic circuit where gates are fully differential MOS current mode logic (MCML).

Figure 11:
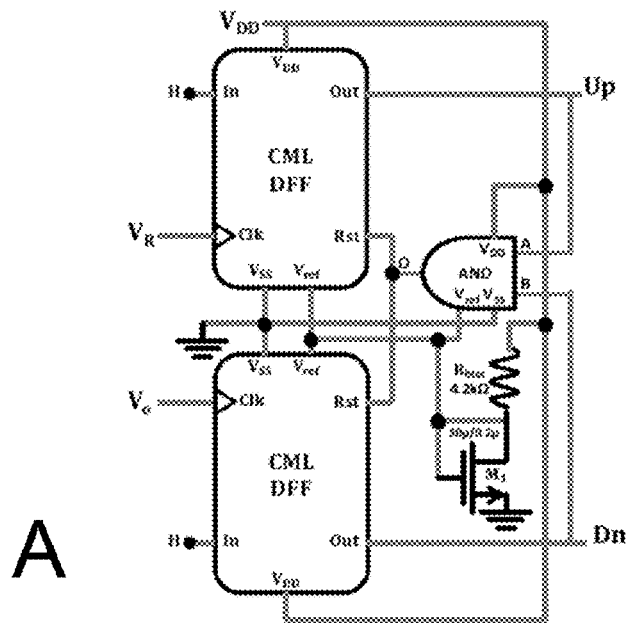
FIG. 11 shows circuit schematics respectively of A) the phase frequency detector (PFD) of the RF RX and (B) the charge pump (CP) of the RF RX.
Figure 11:
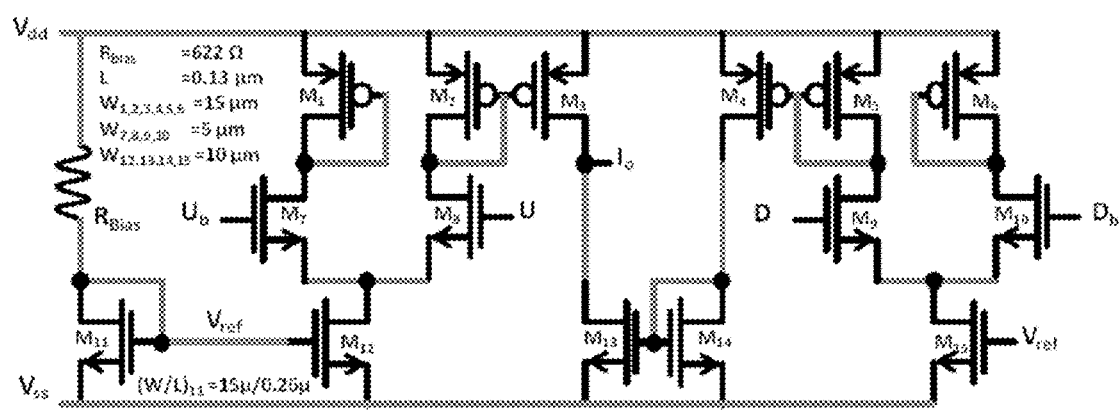

A 3 state CML based differential PFD has been designed for the DLL. The circuit of the PFD is as shown in FIG. 11. The CML based architecture ensures fast response, low noise, and low power operation of the PFD at higher frequencies.

Charge Pump (CP)

A charge pump in DLL takes the U and D signals from PFD and then transfers charge onto or off the loop filter thus changing the control voltage. The designed charge pump is shown in FIG. 11B. This charge pump architecture is specifically designed to perform better with CML based PFD. This CP has good current matching due to symmetric U and D input stages.

Loop Filter

Figure 12:
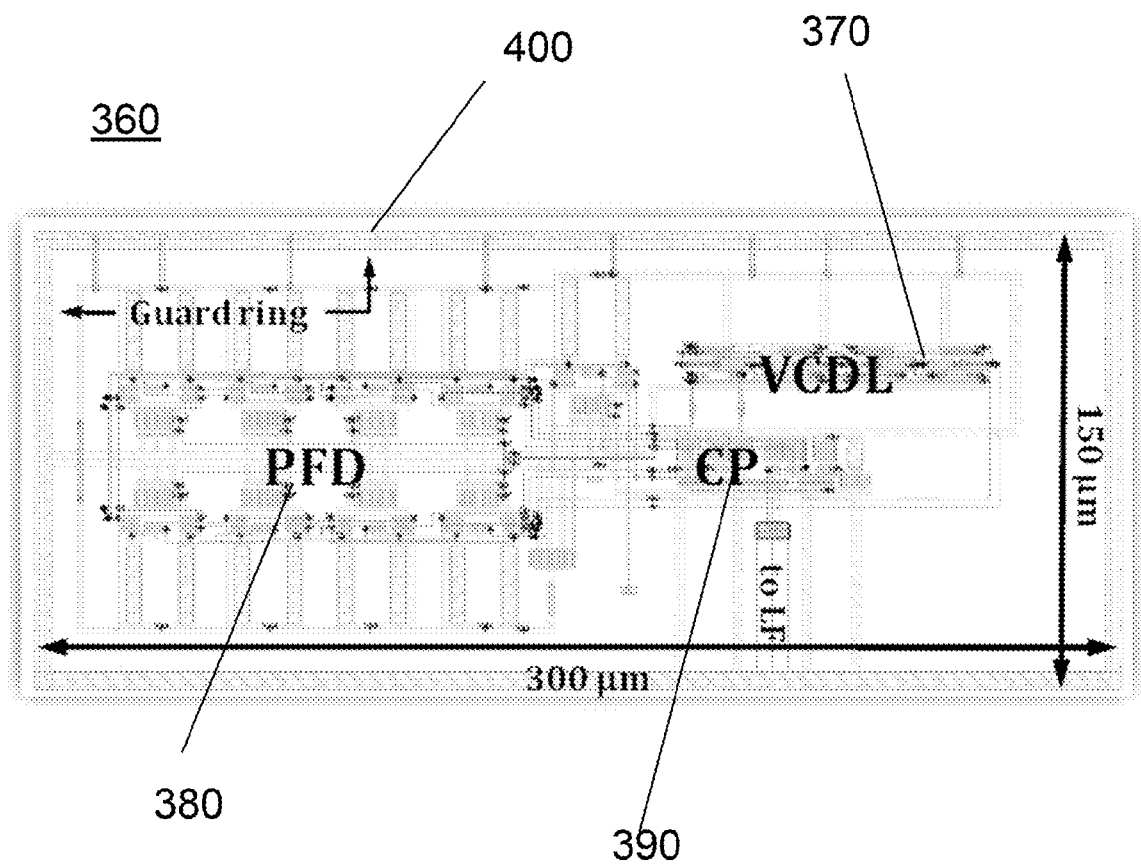
FIG. 12 shows the chip layout of the DLL indicating the Phase Frequency Detector (PFD), Charge Pump (CP) Voltage controlled Delay Line (VCDL) and excluding the loop filter.

The loop filter (LF) at the output of the charge pump is used to integrate the net current from the charge pump and transfer it to a control voltage. The design of the LF for a DLL appears much simpler than PLL but it is still very critical for loop performance, the bandwidth, and the locking time. The LF in this design comprises an on-chip capacitor functioning as an integrator, but optionally may comprise additional components to fine-tune the DLL response. On the receiver chip, the size of the LF capacitor can be fine tuned by means of post processing microsurgery points to fine tune the loop bandwidth and locking time response of the DLL. The chip layout of the implemented DLL, including the PFD, CP and VCDL and excluding the LF, is illustrated in FIG. 12. As shown a guard ring 400 is provided around the DLL structure.

DLL Measurements

The functionality of DLL has been fully tested and performance parameters are measured. The DLL was locking in the range of 4.7 to 5.7 GHz, which covered the desired U-NII band. The whole RX chip consumed 14 mW of power. The measured locking time of the DLL was 7.2 ns.

Design Considerations—LNA

Since the active circuits 340 and 360 are placed inside the antenna 320 there are several challenges associated with the layout of the chip. Placement of the LNA 340, comprising several inductors, inside a small area without affecting the performance of the circuits or the antenna, and facilitating independent testing of different sub-modules, are the most difficult aspects. Also, routing the bias, signal and ground traces to the pads through a complex circuit without breaking any design rules, is difficult. Nonetheless, insight gained from EM and post layout circuit simulations and inclusion of microsurgery points eases some of these challenges. Another consideration is to make the layout as symmetric as possible to ensure true differential operation. As shown in the microphotograph of the chip (FIG. 7), the antenna remains close to the chip edges with minimal interference from nearby metals.

Measured Results

Figure 16:
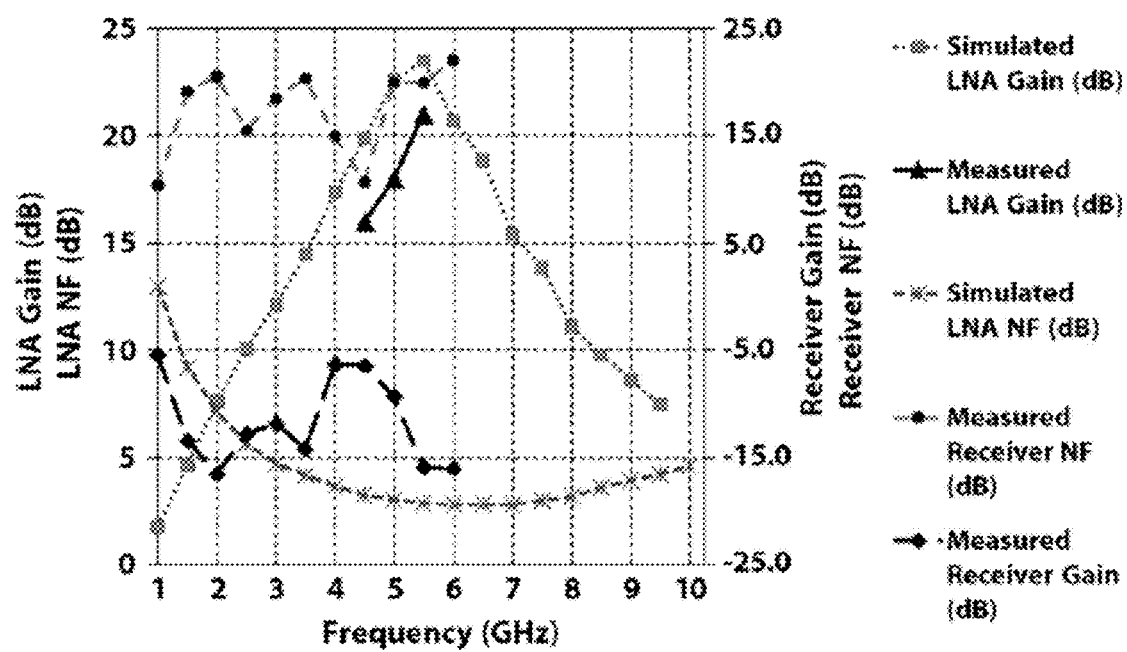
FIGS. 16 shows a graph illustrating the gain and noise figure of the LNA and complete RF receiver; with on-chip antenna.

For testing, some metal connections in the top metal layers were removed through microsurgery techniques (laser trimming) to allow independent testing of the LNA. The LNA receives the dc bias and a known input RF power through an eight pin probe. The output power from the LNA is measured through the same probe. The difference in the levels of the input and output power is equal to the gain of the LNA. A maximum gain of 21 dB has been measured for the 5 GHz range, which is very close to the simulated results as shown in FIG. 16. The dc power consumption of the LNA is 8 mW. Another challenging part of this work was to characterize experimentally the radiation properties of the on-chip dipole antenna. There are multiple problems in executing the standard gain measurement procedure for on-chip dipoles that measure a few millimeters in size (A. Shamim, V. Karam, P. Popplewell, L. Roy, J. Rogers, and C. Plett, "A CMOS active antenna/inductor for System on a Chip (SoC) applications," in IEEE Antennas Propag. Soc. Int. Symp. (AP-S'08), Jul. 5-11, 2008, pp. 1-4.). A moveable microscope with a custom stand is employed to perform the measurements. A transmitter patch antenna with gain $G_P$ is mounted on the stand that can rotate around the receiver chip at a distance of one meter. It is fed through the signal generator with a known transmit power $P_t$. The power is received at bore-sight by another patch antenna placed on the probe station chuck and recorded through the spectrum analyser as $P_{rp}$. The receive patch antenna is then replaced by the receiver chip while the rest of the setup remains the same. The power received by the on-chip antenna, after being amplified by the LNA, is measured and is denoted as $P_{rc}$. The on-chip antenna gain $G_c$ can then be calculated through equation (1), where $LNA_G$ is the LNA gain $$G_c = P_{rc} - P_{rp} + G_p - LNA_G \quad (1)$$

Figure 15:
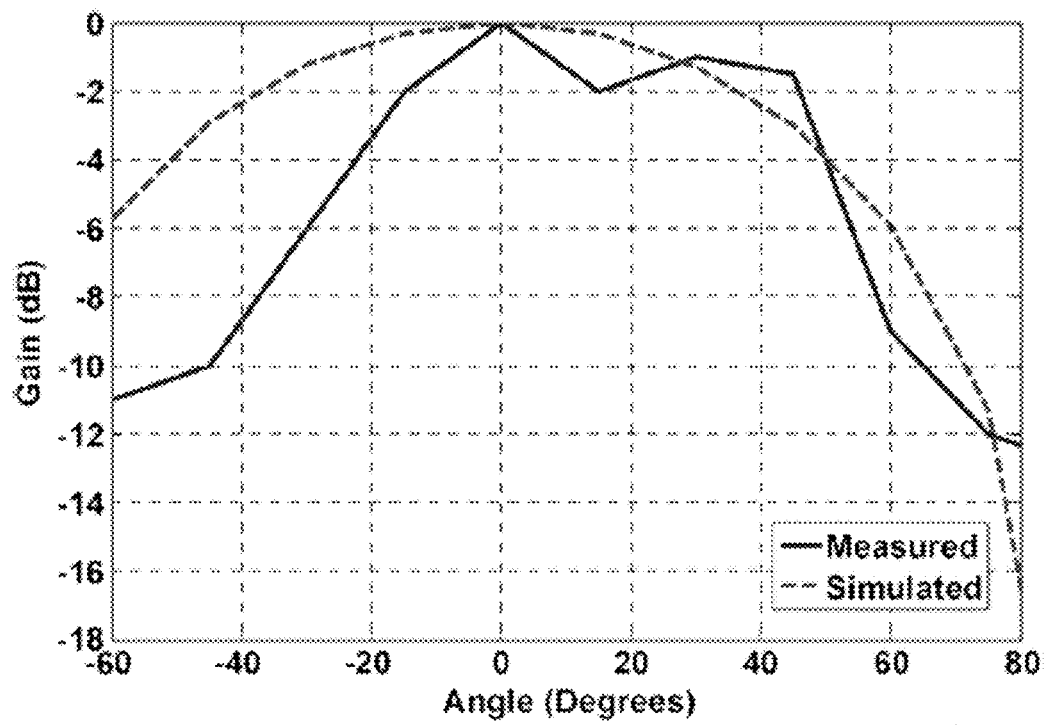

The measured antenna gain from (1) is −35 dBi, which is quite close to the simulated antenna gain. The measured radiation pattern is shown in FIG. 15 and seen to be consistent with the simulated radiation pattern of the dipole antenna shown in FIG. 14.

This design provides the smallest reported CMOS RF receiver chip (1.3 mm²) with a fully characterized on-chip antenna for the 5 GHz band. Co-design of antenna and LNA resulted in a wideband matching without the need for matching elements. The receiver circuits are placed inside the folded antenna to optimize the chip space. Measurements confirm the feasibility of miniaturized receivers for short-range wireless communication.

Most known implementations of LNAs with on-chip antennas, rely on traditional 50Ω matching schemes and do not provide co-design for simultaneous low noise and input power conjugate matching. Moreover, many designs either employ non-standard high resistivity substrates or additional post processing steps, and the antennas and chip sizes are significantly larger. These designs do not place active circuitry inside the antenna nor do they address the effects of having the two in close proximity. A comparison of some LNAs with on-chip antennas is presented in Table I of an article by Muhammad Arsalan, et al., entitled "A fully differential Monolithic LNA with On-Chip Antenna for a Short Range Wireless Receiver", October 2009, IEEE Microwave and Wireless Components Letters.

Moreover, prior designs do not provide characterization of the radiation pattern of the antenna. Embodiments of the present invention address theses shortcomings through a novel miniaturized high performance design, which is fully characterized.

Range

The effective range of the sensor system is determined by a number of factors. Operated alone, the integrated sensor/signal processing and VCO Tx system may be used with a range of a few meters, which is sufficient for some applications. For other applications, the range may be extended by coupling the transmitter to a package antenna.

Ltcc Package With Antenna

By incorporating the TX chip into an LTCC package/antenna the transmission range can be increased significantly.

Two embodiments comprising a package antenna will now be described (a) a folded dipole with a conventional connection and (b) a patch antenna with a contactless aperture-coupled feeding arrangement.

Folded Dipole Package Antenna

Figure 17:
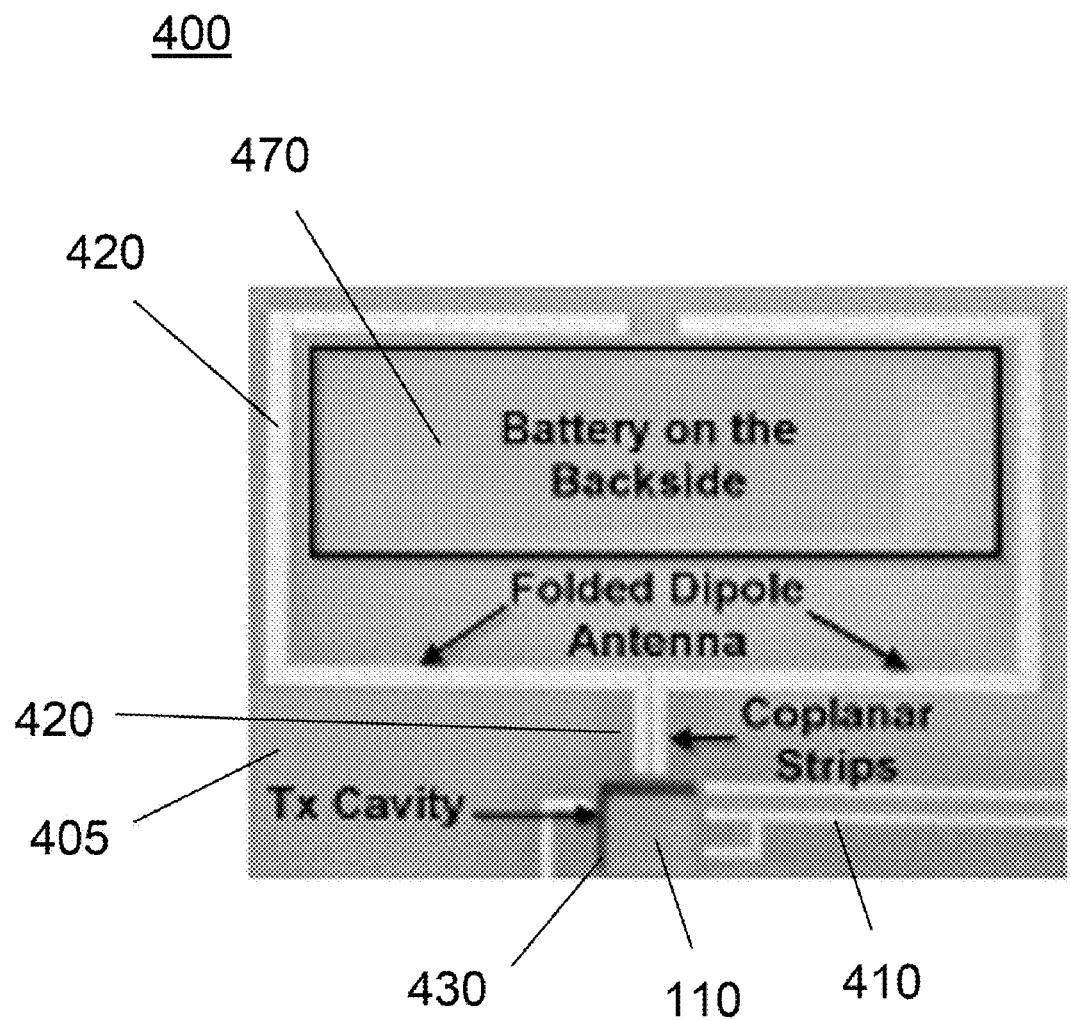
FIG. 17 shows a schematic for a System on Package implementation of a transmitter comprising RF TX chip coupled to a package antenna implemented in a LTCC substrate according to another embodiment.
Figure 18:
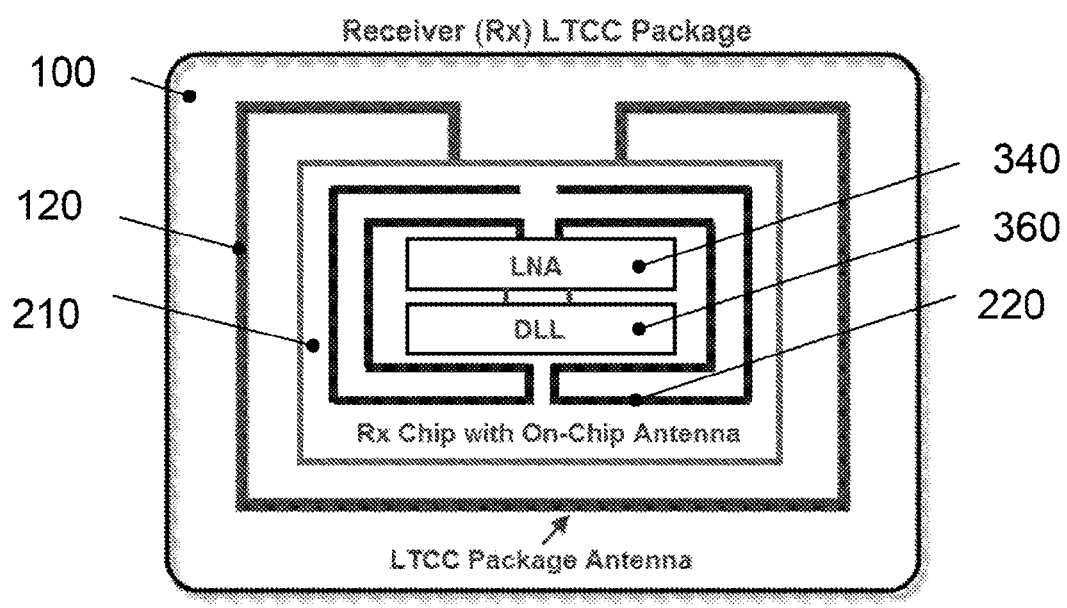
FIG. 18 shows a schematic diagram of a LTCC package wireless receiver module according to yet another embodiment.

An LTCC package 400 comprising an LTCC substrate 405 carrying a folded dipole antenna 420 is shown in FIG. 17. A cavity 430 is provided for an integrated circuit comprising an RF transmitter (TX) as described above. Conventional interconnect is provided between the LTCC package antenna and the RF TX chip, and requires the use of the buffer amplifiers to avoid loading of the VCO 130. In an LTCC package as shown in FIG. 17, the antenna has been designed in an eight layer (800 μm) thick Ferro A6-S process. The input impedance of the antenna is required to conjugate match the output impedance of the TX buffer amplifiers. This avoids the need for additional matching circuit elements. The TX buffer amplifiers exhibit a differential impedance of 32-j12Ω, so the LTCC antenna is designed for a good return loss with reference to this impedance 5.2 GHz. The simulation must take into account the complete package with the antenna for effective co-design. Since the antenna is connected to the TX buffers through CPS lines 420 that are wire bonded to the chip pads, the simulation setup includes the bond wires. A folded dipole antenna is employed for the package antenna to optimize space. It displays a gain of −1 dBi with a boresight radiation pattern. The complete LTCC package dimension is 1.6 cm×1.6 cm. The cavity 430 is provided with appropriate ground and supply connections for the TX chip in addition to the antenna connections. The cavity is five layers thick, for example to accommodate the thickness of the integrated circuit. Another cavity on the back side of the substrate 405 accommodates a battery 470 is attached to the back of the module. The battery is connected to the TX chip through suitable via and pad arrangements (not illustrated). With the buffer amplifiers turned on and properly matched to the package antenna, most of the power will be supplied to it and efficiently radiated. Nonetheless, some power will still be lost through the on-chip inductor since it was optimized as an antenna. The antenna structure resulted in a differential impedance of 48+j25Ω, which in turn provided a return los of 13 dB at 5.2 GHz. The communication range is extended to 75 m. However, this comes at the expense of increase power consumption. This LTCC module consumes 38 mW of power, a large portion of which is due to the TX buffer amplifiers, relative to 3.3 mW and 2 m transmission range for the SoC with on-chip antenna It will be appreciated that, a receiver (RX) module, such as shown schematically in FIG. 18, may be similarly constructed with a package antenna, using multilayer LTCC packaging.

Aperture Coupled Patch Antenna

An aperture coupled patch topology utilizes a common ground plane between the radiating antenna and the feed line. In a preferred embodiment 500 of a LTCC package comprising a transmitter with on-chip antenna as described above, aperture coupling allows for direct coupling of the TX on-chip antenna to an LTCC patch antenna, without the need of a microstrip feed line. In addition, the buffer circuits can remain off. Also, the ground plane in between the patch antenna and the TX chip will act as a shield for the TX circuits. However, a limitation of this technique is that the slot in the ground plane can radiate considerably in the backward direction. This unwanted radiation can be reduced, and is preferably minimized, by choosing the right slot length with respect to the patch size.

Figure 19:
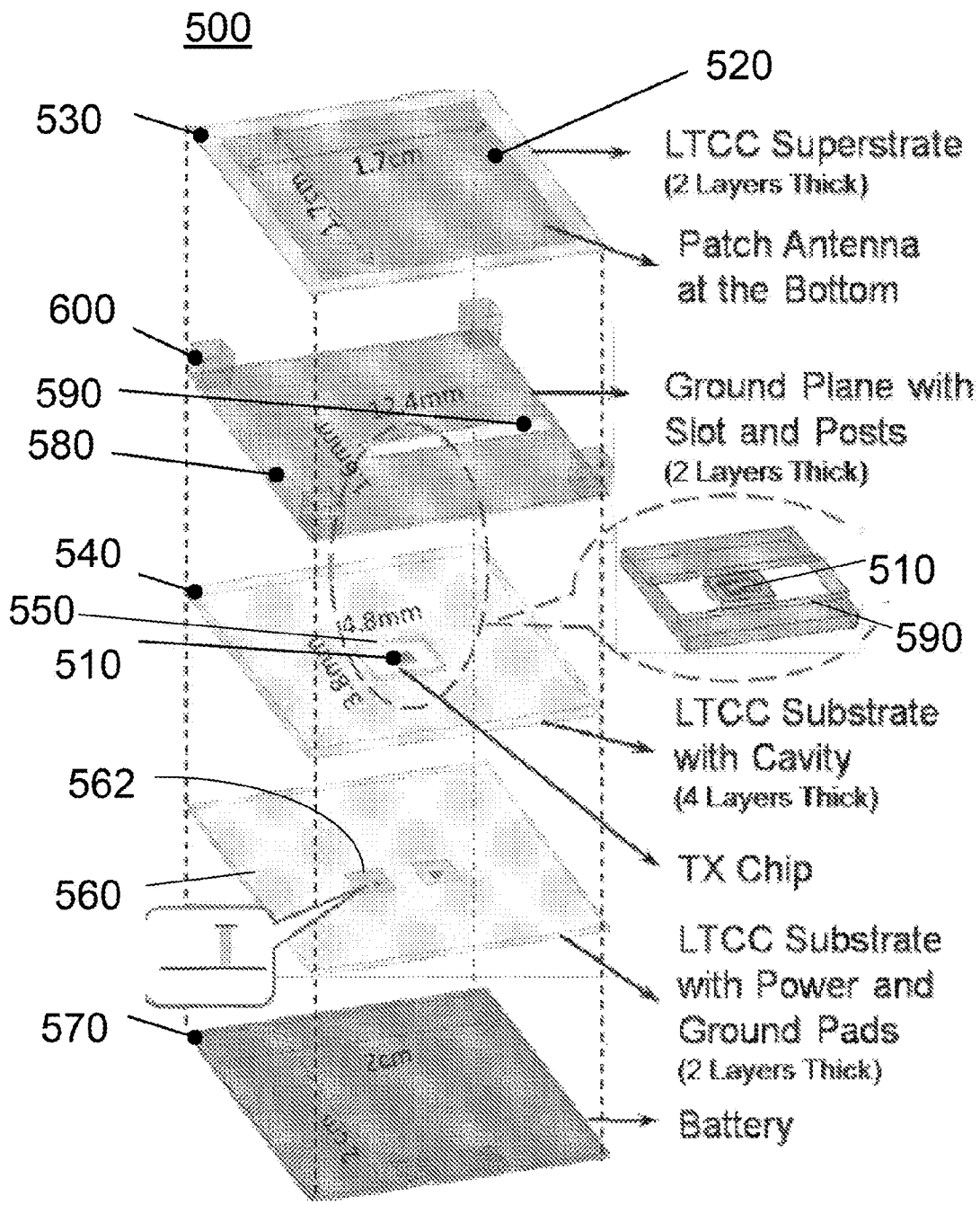
FIG. 19 shows an exploded view of a LTCC packaged transmitter module comprising an RF transmitter TX with on-chip antenna which is aperture coupled to a patch antenna carried by the package according to a further embodiment.
Figure 20:
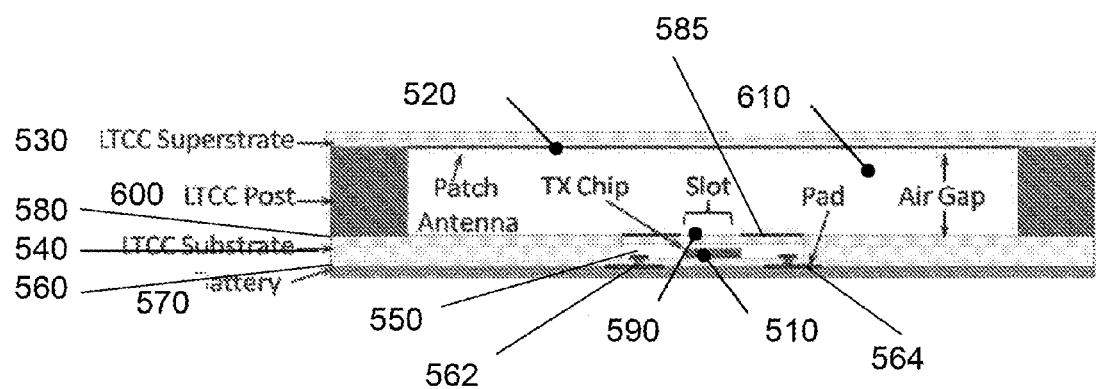
FIG. 20 shows a cross-section through the assembled LTCC packaged RF TX module.

As shown in FIGS. 19 and 20, an LTCC package module 500 of this preferred embodiment comprises RF transmitter chip, similar to that described 510 above, with an on chip antenna, which is electromagnetically coupled with a package patch antenna 520 carried by a superstrate 530 of the package. A Ferro A6-S LTTC tape system is employed. Each layer of the package has a fired thickness of 100 μm. The substrate portion 540 is chosen to be 8 layers thick so that it will house a 300 μm thick RF Tx chip in a cavity 550. The cavity thickness is chosen to be 600 μm to accommodate the chip and the biasing bond wires, which connect the chip 510 to the power and ground pads on the underlying substrate layer 560. A battery 570 is mounted on the back of the bottom substrate layer 570. The LTCC fabrication rules require a minimum of two layers beneath the cavity 550, thus resulting in a total substrate thickness of 800 μm. The superstrate 530 comprising the antenna can be of any other LTCC material, however for simplicity the same LTCC tape system is used for the antenna substrate as well. A ground plane 580, comprising an aperture in the form of a slot 590 overlies substrate 540 carrying the TX chip 510, with the slot aligned to the on-chip antenna 520 of the TX chip 510. A spacer comprising 4 spacer posts 600 separates the ground plane 580 from the overlying strip line patch antenna 520 carried by the superstrate 530, to define a gap, i.e. an air gap 610 of a required thickness, as shown in the cross-sectional view of the assembled LTCC module illustrated in FIG. 20, and as will be explained below.

LTCC Design

The design procedure is as follows. First of all, a conventional aperture coupled patch antenna with a microstrip feed line is simulated in HFSS. This determines the approximate size of the patch antenna at 5.2 GHz, the feed location and the slot dimensions. Next, the microstrip line is replaced with the TX chip. The design is optimized for maximum coupling between the on-chip antenna and the LTCC patch antenna through the slot in the ground plane. This maximizes the overall gain of the TX module. The thicknesses of the air gap and the superstrate determined this way are an initial estimate of the design and will change during the final optimization. The patch antenna dimensions of 1.7 cm×1.7 cm are obtained in simulations. The substrate, superstrate and ground plane dimensions are 2 cm×2 cm. The feed line is placed below the centre of the patch antenna to maximize magnetic field coupling. After determination of the approximate patch size and feed point location, the microstrip feed line is replaced with the TX chip. The chip is placed in a cavity sized 4.8 mm×3.8 mm exactly at the location where the microstrip line fed the patch. The size of the cavity is chosen so as to leave enough room for the power routing and bond wires after placing the chip in the cavity. The cavity size remains the same for the lower four layers, however it is made the same width as that of the slot in the ground plane for the top two layers. This is done to avoid fabrication complexities. The patch antenna is on the bottommost layer of the superstrate. The air gap is realized through four spacers or corner posts made of the same LTCC tape system as the substrate. The layer-by-layer layout of the aperture coupled module, in an exploded view, along with the final dimensions is shown in FIG. 19. A cross-sectional view of the LTCC module is shown in FIG. 20.

Figure 21:
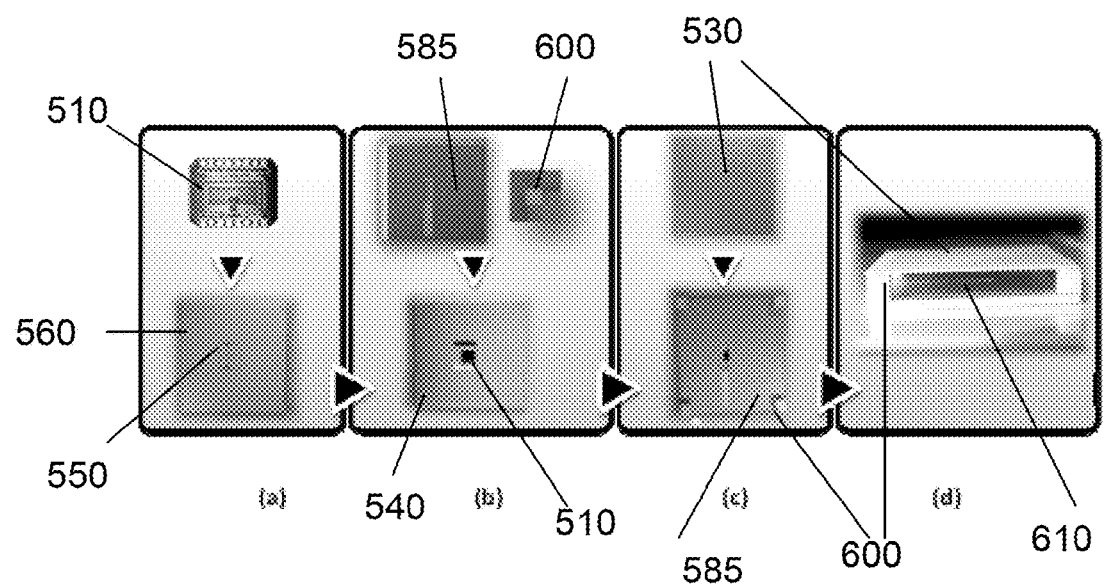
FIG. 21 shows photomicrographs of the three LTCC layers sub-structures (a), (b), and (c) used to construct the LTCC TX module (d), as shown in FIGS. 19 and 20.

FIG. 21 shows photomicrographs illustrating how this package module is built up from 3 sub-structures (a), (b) and (c). The bottom six layers of the substrate (a) are fired together, whereas the top two layers (b) and (c) are fired separately. This is done in order to ease the placement and wire bonding of the chip in the cavity. The top two layers 580 of the substrate, along with the four spacers (corner posts) 60 and superstrate 530 are glued to the substrate after the placement of the chip 510. The power and ground pads in the cavity connect to the pads 562,564 on the bottom of the substrate through vias. The bottom pads connect to the contacts of a power source comprising a custom-made lithium polymer battery. The battery 570 has the same lateral dimensions as that of the substrate 560 and it can be simply glued to the bottom of the substrate as shown in FIG. 20. The design is sensitive to a number of parameters, the most important being the location, length, and width of the slot in the ground plane. Other important parameters are the air gap and supersaturate thicknesses. Extensive parametric simulations are required to optimize many parameters at the same time. The goal is to maximize the gain of the module by efficient coupling between the on-chip antenna and the LTCC antenna through the slot in the ground plane, without affecting the RF properties of the circuit. First of all, keeping the slot length and width the same as that of the microstrip fed case, the thicknesses of the air gap and superstrate are optimized. After achieving a reasonable gain value, the thicknesses are kept constant and the slot length and width are optimized. It is observed in simulations that extending the slot length to the extreme right edge of the substrate results in maximum gain. Finally, the thicknesses of the air gap and superstrate are optimized again with the new slot dimensions. It is worth mentioning that this technique works on near field coupling and thus, the far field radiation pattern of the on-chip antenna is insignificant here.

In this embodiment, a combination of air gap thickness of 2 mm and superstrate thickness of 1.8 mm increases the gain of the module from the on-chip antenna gain of −34 dBi to 0.5 dBi. This significant improvement is achieved without any physical connection or elaborate matching of the RF circuit to the external antenna. However, the superstrate thickness of 1.8 mm (18 LTCC layers) would not be an economically viable solution because it does not contain any other passives except the patch antenna. Therefore the design was re-optimized for a thinner superstrate by compromising somewhat on the gain. A superstrate thickness of 0.2 mm, with an air gap thickness of 2.4 mm, yields a gain of −2.3 dBi. Thus, in this exemplary embodiment, the on-chip antenna coupling to the LTCC patch antenna improves the module gain by 32 dB and range by 23 m in comparison to the on-chip antenna alone.

Figure 22:
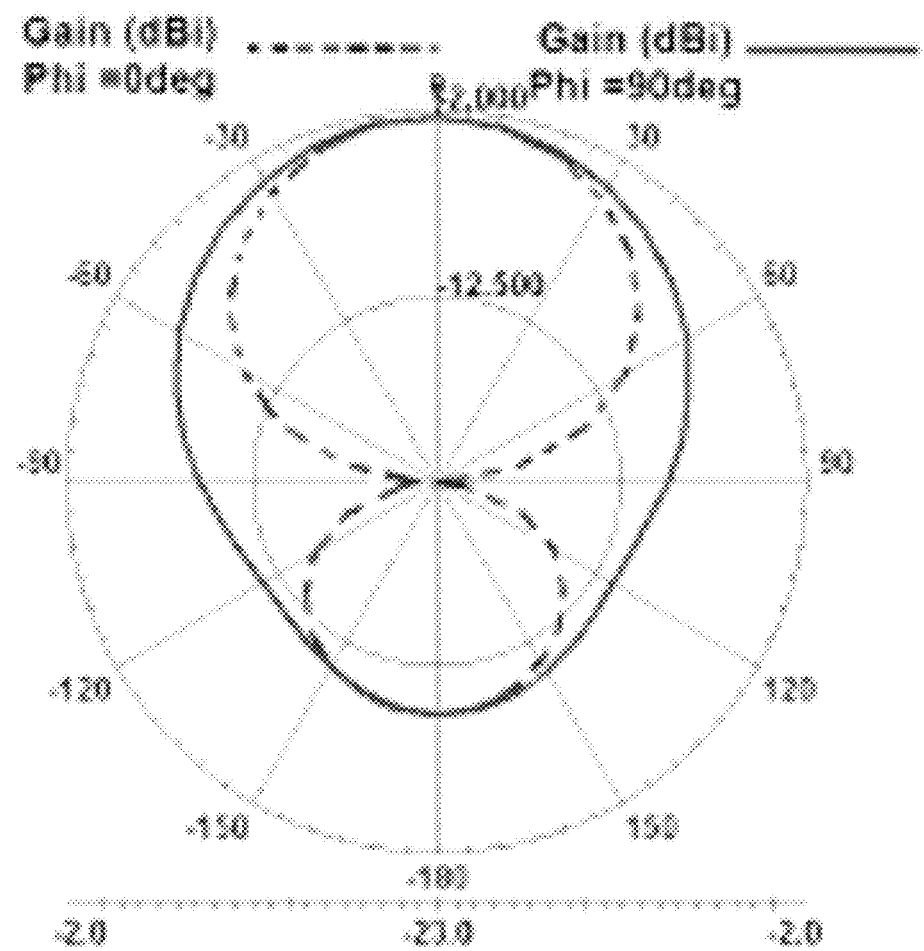
FIGS. 22 and 23 show, respectively, the aperture coupled LTCC patch antenna gain and radiation pattern and the TX VCO inductor performance with and without aperture coupling.
Figure 23:
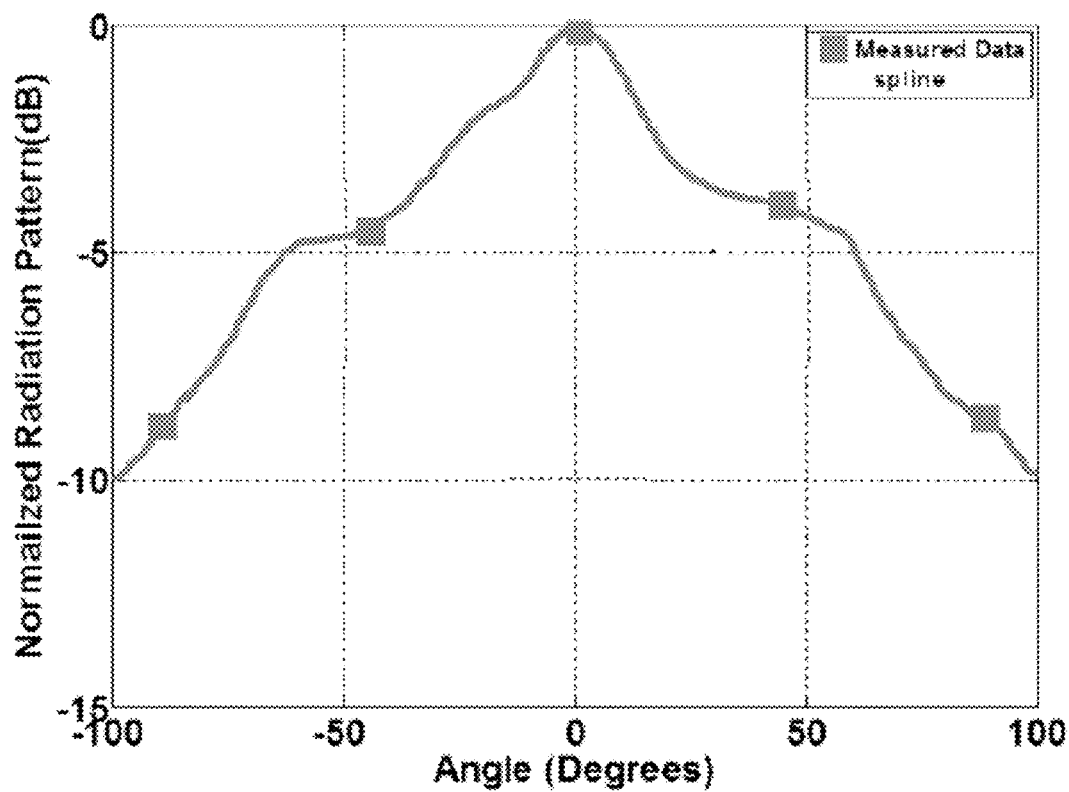

FIGS. 22 and 23, respectively, illustrate the gain and radiation pattern of the LTCC aperture coupled patch antenna. The back lobe is reduced to a level approximately 10 dB lower than the front lobe by optimizing the slot length. The RF performance of the on-chip antenna/inductor has been affected slightly but is still within acceptable operational limits of the TX module.

Figure 24:
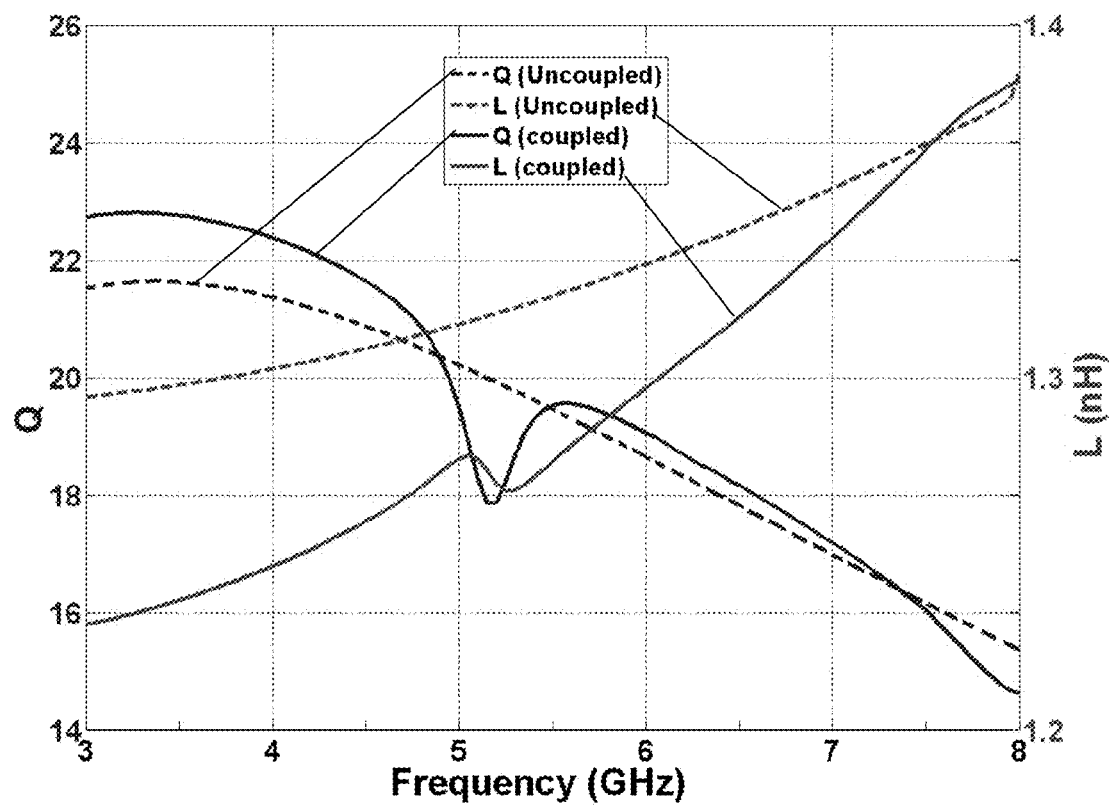
FIG. 24 shows graphically the L and Q of the on-chip inductor with and without coupling to the slot and patch antenna.
Figure 25:
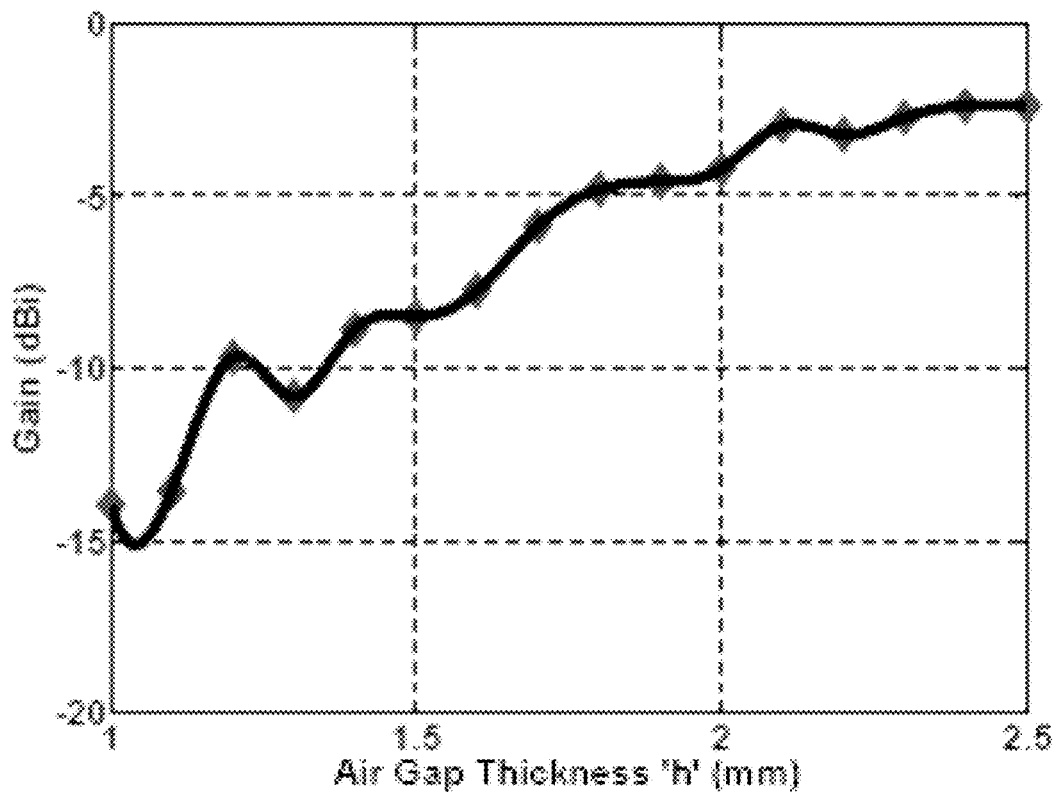
FIG. 25 shows graphically the gain of the LTCC package patch antenna versus air gap thickness.

FIG. 24 compares the L and Q of the on-chip inductor with and without coupling to the slot and the patch antenna. A clear notch can be seen in both the L and Q curves at the frequency of interest, which shows the coupling, however the deviation from the nominal values is not detrimental. The gain as a function of the thickness of the air gap, while keeping other parameters constant, is shown in FIG. 25. It shows that a fabrication tolerance of up to 300 μm is permissible without affecting maximum gain.

Thus, a novel LTCC based TX SoP implementation has been demonstrated, which makes use of on-chip antenna to LTCC package antenna coupling through an aperture in the common ground plane. This strategy is useful as it eliminates the need for isolating buffers, bond pads, bond wires, matching elements, baluns and transmission lines. It not only reduces the number of components and simplifies SoP design but also consumes lower power.

Table I, shown in FIG. 26, compares the performance of the three embodiments of the TX modules described above. All modules utilize a receiver with a sensitivity of −70 dBm, which is attached to an antenna with a gain of 6.5 dBi. It is evident that the proposed aperture coupled LTCC module is the best solution in terms of achieving a balance between communication range and power consumption.

From the Friis formula, the aperture coupled design provides 23 m more range than the TX with on-chip antenna, without increasing the power consumption. The conventional LTCC package, on the other hand, provides 3 times more range than the proposed design but consumes 12 times more power. The chip coupling to LTCC patch antenna as illustrated by the embodiments shown in FIGS. 19 and 20 improves the TX module gain by 32 dB and range by 23 m as compared to the on-chip antenna alone, without affecting the RF circuit performance and power consumption. The conventional LTCC package, as illustrated by the embodiment shown in FIG. 17, which employs a folded dipole antenna connected to the TX chip through bond wires and coplanar strip (CPS) lines has an extended range of 75 m, i.e. it provides 3 times more range than the wireless coupled LTCC patch antenna design, but at the expense of consuming 12 times more power. The proposed chip to patch coupling strategy not only reduces the number of components, cost, and power consumption but also simplifies the design process for RF SoP modules.

Alternative Embodiments

The embodiments described above are optimized for the 5 GHz U-NII band which has particular utility for WiLAN and biomedical applications, While design of miniaturized antennas for lower frequencies, particularly below 2 GHz, is likely to be a challenge, since antenna size depends on frequency, it is believed that the design methodology may be extended to a broader range of frequencies from about ~1 GHz to 10 GHz. In particular, for wireless coupling of an on-chip antenna to a package patch antenna, the design may potentially be extended to around 50 GHz.

Also while LTCC multilayer packaging is described in a preferred embodiment, other suitable low loss substrates may be used, for example, LPE, PTFE, Glass, LCP (liquid crystal polymer) or other known multilayer substrates with low loss over the desired operating frequency band.

In preferred embodiments of the dual mode active antenna described above, a rectangular or square loop antenna is described. In alternative embodiments an octagonal or other loop design may be used which is optimized both as an antenna and an oscillator inductor.

In the embodiment described above, the date signal source input to the oscillator transmitter is a sensor means, for example a MOSFET sensor for bio-medical applications such as for monitoring, radiation, temperature or other vital signs, or environmental parameters. For example, an exemplary, low power, low voltage, radiation sensor, is described for example, in copending U.S. patent application Ser. No. 12/580,670 filed concurrently herewith, entitled "Miniaturized, Low Power, FGMOSFET Radiation Sensor and Wireless Sensor Systems". Many other types of sensors may alternatively be used, and wireless systems as described above may be more generally applicable for wireless transmission of data signals from other signal processing circuitry.

Design Constraints

As noted above, the co-design methodology used to enable integration of RF, digital and analog elements of the circuits required electromagnetic, microwave and circuit simulators to tackle multi-domain issues. Iterative back and forth simulations are required for planning metal fill in the layout. To implement the embodiments described above in standard CMOS technology, because antennas are not typically on-chip, layout and metal fill poses particular challenges. There are no dedicated metal layers and no specific design rules for layout of on-chip antennas, and novel approaches are needed to circumvent design rule checks (DRC). For example to provide the large metal width required for the antenna, during fabrication a ground connection is provided to one of the antenna arms, which is subsequently removed by microsurgery. In practice, standard integration of on-chip antennas would require development of appropriate design rules specific to on-chip antennas.

The close proximity of the integrated antenna and circuit elements, including inductors and near by bond pads, may adversely affect antenna performance and/or interfere with circuit performance. Careful placement of components, and EM simulation, was used to reduce parasitic coupling. Use of guard rings around circuits and inductors helps to reduce undesired coupling through the substrate. Tuning elements are added to compensate for process variations, for example band switching capacitors in the TX VCO.

In the embodiments described above, test structures and microsurgery points are included, to allow for testing and characterization. In practice, such structure may be optional.

Embodiments of the systems described above are implemented using low cost CMOS technology, to demonstrate the feasibility of low cost CMOS implementations using standard silicon process technology. Custom CMOS, or fabrication of the SoC using hybrid technologies may provide higher gain of the antenna to save power and increase communication range, at the expense of higher cost.

It will also be appreciated that although embodiments are described in detail for implementation of RF TX and RX circuits with on-chip antenna for operation in the 5 GHz U-NII band, the same design principles may be extended for operation at other frequencies. Since miniaturization of RF TX/RX circuits and antenna at lower frequencies is more challenging for operation at higher frequencies, such designs may be beneficially implemented at other frequencies in the range up to around 50 GHz Further details of this, including design methodology, characterization and analysis of the structures described herein are disclosed in publications by the inventors referenced herein, and also in a Ph.D. thesis of Atif Shamim, entitled "Wireless System on a Chip and System-on-Package design for biomedical applications", and in a Ph.D. thesis of Muhammad Arsalan, entitled "Wireless System on a Chip Sensor Design for Radiotherapy Applications", Carleton University, 2009, to which the reader is directed for reference.

All publications, patents and patent applications cited in this specification are herein incorporated by reference as if each individual publication, patent or patent application were specifically and individually indicated to be incorporated by reference. The citation of any publication is for its disclosure prior to the filing date and should not be construed as an admission that the present invention is not entitled to antedate such publication by virtue of prior invention.

Although specific embodiments of the invention have been described and illustrated in detail, it is to be clearly understood that the same is by way of illustration and example only and not to be taken by way of limitation, the scope of the present invention being limited only by the appended claims.

The invention claimed is:

1. A Radio Frequency (RF) transmitter system comprising:
   a substrate of a multilayer package supporting a monolithically integrated circuit (chip) comprising an RF transmitter comprising an on-chip loop antenna, wherein the loop antenna is placed symmetrically near edges of the chip and active circuitry of the RF transmitter is placed within the loop antenna;
   a ground plane overlying the on-chip loop antenna;
   a superstrate of the multilayer package carrying a patch antenna overlying the ground plane and spaced therefrom by a gap; and
   an aperture defined in the ground plane overlying the chip, with the loop antenna aligned to edges of the aperture, for near field electromagnetic coupling of the on-chip antenna and the patch antenna.

2. An RF transmitter system according to claim 1 wherein the aperture is a slot in the ground plane aligned to the on-chip antenna.

3. An RF transmitter system according to claim 2 wherein the slot length is selected relative to the patch antenna size to reduce backward radiation from the slot in the ground plane.

4. An RF transmitter system according to claim 1 wherein the substrate and superstrate comprise substrate and superstrate layers respectively of a low temperature co-fired ceramic (LTCC) multilayer package.

5. An RF transmitter system according to claim 4 wherein:
   the ground plane comprises a common ground plane provided on a top surface of the LTCC substrate overlying the RF transmitter chip, and the aperture comprises a slot in the ground plane aligned with the on-chip antenna;
   and wherein the LTCC superstrate carrying the patch antenna is separated from the substrate by spacer means to space the substrate and the superstrate by an air gap.

6. An RF transmitter system according to claim 5 comprising a rechargeable power source carried by the substrate, comprising an ultracapacitor or a lithium polymer cell, interconnected with the RF transmitter chip.

7. An RF transmitter system according to claim 1 operable in the 5GHz U-NII band.

8. An RF transmitter system according to claim 1 further comprising a power source.

9. An RF transmitter system according to claim 1 wherein the RF transmitter comprises a voltage controlled oscillator (VCO) transmitter, and further comprising a data signal source comprising signal processing means coupled to an input of the VCO transmitter.

10. An RF transmitter system according to claim 9 wherein the data signal source comprises a sensor means comprising one or more MOSFET sensors or FGMOSFET sensors.

11. A radio frequency (RF) transmitter comprising:
a monolithically integrated circuit (chip comprising a semiconductor substrate having fabricated thereon an RF oscillator transmitter (TX) circuit comprising an on-chip antenna, wherein the RF oscillator TX circuit comprises a direct feed, open loop voltage controlled oscillator (VCO) TX, wherein a feed line of the oscillator is directly modulated by an input signal;
an off-chip antenna and a common ground plane comprising an aperture aligned to the on-chip antenna and the off-chip antenna; and
the on-chip antenna being configured as a dual mode active antenna wherein;
the on-chip antenna is inductive and acts as VCO tank inductor of the RF oscillator transmitter circuit; and the on-chip antenna is placed symmetrically on the semiconductor substrate extending close to edges of the semiconductor substrate free from active circuitry and active circuitry of the RF oscillator transmitter circuit is placed within an area defined by the on-chip antenna, to provide a far field radiation pattern for short range transmission and to act as source for near field aperture coupling to the off-chip antenna for extended range transmission.

12. An RF transmitter according to claim 11 wherein the on-chip antenna comprises a loop antenna and active circuitry of the transmitter is placed within the antenna loop, at least part of the antenna loop extending close to edges of the substrate free from active circuitry.

13. An RF transmitter according to claim 12 wherein the loop antenna comprises a rectangular loop and two opposite sides of the loop are placed closed to edges of the substrate free of active circuitry, and input/output pads are located along other sides of the loop.

14. An RF transmitter according to claim 11 wherein the VCO TX comprises an LC cross-coupled differential VCO topology.

15. An RF transmitter according to claim 11 for operation at a frequency in the range of ~1GHz to ~10GHz.

16. An RF transmitter according to claim 11 for operation at one or more frequencies in the 5.2GHz U-NII band.

17. An RF transmitter according to claim 11 wherein the semiconductor substrate comprises a low resistivity silicon substrate.

18. An RF transmitter according to claim 17 fabricated as CMOS integrated circuit, wherein the on-chip antenna comprises a top metal layer of a CMOS process stack.

19. An RF transmitter according claim 11 fabricated on a substrate area of ~1.5 mm$^2$ or less.

20. An RF transmitter according to claim 11 wherein the inductor antenna has an inductance of at least 1 nH and/or a differential Q greater than 10.

* * * * *